United States Patent [19]
Ueda et al.

[11] Patent Number: 6,111,481
[45] Date of Patent: Aug. 29, 2000

[54] SURFACE-ACOUSTIC-WAVE THREE INTERDIGITAL ELECTRODES WITH DIFFERENT NUMBERS OF FINGER PAIRS

[75] Inventors: Masanori Ueda; Gou Endoh; Osamu Kawachi; Yoshiro Fujiwara, all of Kawasaki, Japan

[73] Assignee: Fujitsu Limited, Kawasaki, Japan

[21] Appl. No.: 09/363,804

[22] Filed: Jul. 30, 1999

Related U.S. Application Data

[62] Division of application No. 08/760,097, Dec. 3, 1996, Pat. No. 5,963,114.

[30] Foreign Application Priority Data

May 28, 1996 [JP] Japan .................................. 8-133675

[51] Int. Cl.[7] .................................................. H03H 9/64
[52] U.S. Cl. ...................... 333/194; 333/195; 310/313 B
[58] Field of Search .................................. 333/193–196; 310/313 R, 313 B, 313 C, 313 D

[56] References Cited

U.S. PATENT DOCUMENTS

| 4,365,219 | 12/1982 | Nathan | 333/193 |
|---|---|---|---|
| 5,130,681 | 7/1992 | Ohnuki et al. | 333/194 |
| 5,309,126 | 5/1994 | Allen | 333/193 |
| 5,334,960 | 8/1994 | Penunuri | 333/193 |
| 5,363,074 | 11/1994 | Higgins, Jr. | 310/313 B |
| 5,485,052 | 1/1996 | Seki et al. | 333/193 X |
| 5,666,092 | 9/1997 | Yamamoto et al. | 333/194 |
| 5,874,868 | 2/1999 | Shimoe | 333/193 |

FOREIGN PATENT DOCUMENTS

| 2 437 108 | 4/1980 | France . | |
|---|---|---|---|
| 44 31 612 | 3/1995 | Germany . | |
| 58-182313 | 10/1983 | Japan | 333/193 |
| 64-54805 | 3/1989 | Japan | 333/195 |
| 64-82706 | 3/1989 | Japan | 333/195 |
| 3-27611 | 2/1991 | Japan . | |
| 3-270309 | 12/1991 | Japan | 333/193 |
| 4-54011 | 2/1992 | Japan . | |
| 5-55872 | 3/1993 | Japan | 333/193 |
| 5-63499 | 3/1993 | Japan . | |
| 5-114830 | 5/1993 | Japan . | |
| 5-121997 | 5/1993 | Japan | 333/193 |
| 5-136651 | 6/1993 | Japan | 333/193 |
| 5-267990 | 10/1993 | Japan . | |
| 5-335881 | 12/1993 | Japan . | |
| 2 116 387 | 9/1983 | United Kingdom | 333/193 |
| 2 288 503 | 10/1995 | United Kingdom . | |

OTHER PUBLICATIONS

T. Morita et al., "900 MHZ Range Wideband Double Mode Saw Filters", *Toyo Communication Equipment Co., Ltd.*, May 28, 1992, pp. 7–16. (Translation provided).

*Primary Examiner*—Robert Pascal
*Assistant Examiner*—Barbara Summons
*Attorney, Agent, or Firm*—Staas & Halsey, LLP

[57] ABSTRACT

A double-mode surface-acoustic device having a piezoelectric substrate with two reflectors placed on the piezoelectric substrate and first through third interdigital electrodes placed on the substrate consecutively between the two reflectors. Each electrode containing first through third number of pairs of electrode fingers, respectively.

1 Claim, 20 Drawing Sheets

SURFACE-ACOUSTIC-WAVE THREE INTERDIGITAL ELECTRODES WITH DIFFERENT NUMBERS OF FINGER PAIRS

This application is a division of application Ser. No. 08/760,097, filed Dec. 3, 1996, now allowed U.S. Pat. No. 5,963,114.

BACKGROUND OF THE INVENTION

The present invention generally relates to surface-acoustic-wave (SAW) devices and more particularly to a SAW device having an improved pass-band characteristic. Further, the present invention relates to a SAW device that is flexible in design for setting input and output impedances of the SAW device as desired.

SAW devices are used extensively for a filter or a resonator in compact radio telecommunication apparatuses operational in a VHF or UHF band, a typical example being a portable telephone apparatus operational in a MHz band or GHz band.

In such high frequency radio telecommunication apparatuses, it is required that the SAW filters or SAW resonators used therein have a wide pass-band and simultaneously a very sharp off-band attenuation. Further, the SAW filters and resonators should be able to achieve an impedance matching with a cooperating circuit, which may be an integrated circuit forming the electronic apparatus in which the SAW device is used.

FIGS. 1A and 1B show the construction of a typical conventional SAW filter.

Referring to FIG. 1A, the SAW filter is a device of the so-called double-mode type and includes a pair of reflectors 10A and 10B on a piezoelectric substrate 1 as usual in a SAW filter, wherein the piezoelectric substrate may be a Y-X cut single-crystal plate of $LiTaO_3$ or $LiNbO_3$. Further, electrodes 11A, 11B and 11C are provided consecutively between the foregoing reflectors 10A and 10B from the reflector 10A to the reflector 10B.

In the illustrated example of FIG. 1A, the substrate 1 is formed of a single-crystal plate of 36° Y-X $LiTaO_3$, and the reflectors 10A and 10B, aligned in an X-direction of the substrate 1, define a propagation path of a surface acoustic wave excited on the piezoelectric substrate 1. Each of the electrodes 11A, 11B and 11C includes a primary-side interdigital electrode such as an electrode $(11A)_1$, $(11B)_1$ or $(11C)_1$ and a secondary-side interdigital electrode such as an electrode $(11A)_2$, $(11B)_2$ or $(11C)_2$, wherein the primary-side electrode and the secondary-side electrode are disposed such that the electrode fingers of the primary-side electrode and the electrode fingers of the corresponding secondary-side electrode extend in respective, mutually opposing directions, as usual in an interdigital electrode. Thereby, the electrode fingers of the primary-side electrode and the electrode fingers of the secondary-side electrode are repeated alternately in the X-direction on the substrate 1 and intersect the path of the surface acoustic wave traveling in the X-direction on the substrate 1. The pitch of the electrode fingers is determined by a central frequency of the SAW filter to be formed as well as by the sound velocity of the surface acoustic wave traveling on the substrate 1 in the X-direction. When viewed in the X-direction, the electrode fingers of the primary-side electrode and the electrode fingers of the secondary-side electrode overlap with each other over an overlap width W.

In the construction of FIG. 1A, the primary-side electrode $(11A)_1$ of the electrode 11A is connected to an input terminal commonly with the primary-side electrode $(11C)_1$ of the electrode 11C. On the other hand, the secondary-side electrodes $(11A)_2$ and $(11C)_2$ are both grounded. Thereby, the SAW filter of FIG. 1A forms a device of the so-called dual-input single-output type.

The double-mode SAW filter of such a construction uses a first-order mode of surface acoustic wave formed between the foregoing reflectors 10A and 10B with a frequency $f_1$ and a third-order mode of surface acoustic wave formed also between the reflectors 10A and 10B with a frequency $f_3$, wherein the SAW filter forms a pass-band characteristic as indicated in FIG. 2. FIG. 2 shows the attenuation of the SAW filter as a function of the frequency. In FIG. 2, it should be noted that a pass-band is formed between the foregoing frequency $f_1$ of the first-order mode and the frequency $f_3$ of the third-order mode. FIG. 1B shows the energy distribution of the surface acoustic wave excited in the structure of FIG. 1A.

Conventionally, it has been practiced to form the interdigital electrodes 11A–11C to be generally symmetric about the center of the X-axis in view of the corresponding symmetricity of the first-order mode and the third-order mode of the excited surface acoustic waves (see FIG. 1B), so that the first order-mode surface acoustic wave and the third-order-mode surface acoustic wave are excited efficiently. Thus, it has been practiced conventionally to set a number $N_1$ indicating the number of the electrode finger pairs formed by the primary-side electrode fingers and the secondary-side electrode fingers in the interdigital electrode 11A, to be equal to a number $N_3$ indicating the number of the electrode finger pairs formed by the primary-side electrode fingers and the secondary-side electrode fingers in the interdigital electrode 11C ($N_1=N_3$).

However, FIG. 2 clearly indicates that various spurious peaks exist in the SAW device outside the pass-band defined by the frequencies $f_1$ and $f_3$. As a result of the existence of such spurious peaks, it should be noted that the sharpness of attenuation of surface acoustic wave outside the pass-band is reduced unwantedly, particularly in the frequency range between 1550 MHz and 1600 MHz. It should be noted that the attenuation of a SAW filter or resonator should be flat and minimum inside the pass-band and increase sharply outside the pass-band. In order to maximize the selectivity of the filter, it is desired to maximize the attenuation outside the pass-band.

In the conventional SAW filter of FIG. 1A, all of the interdigital electrodes 11A, 11B and 11C have the same overlap width W of the electrode fingers. Thus, the input and the output impedances of the SAW filter are determined by the number of pairs of the electrode fingers in the electrodes 11A–11C. Generally, it should be noted that the input and output impedances of a SAW filter are inversely proportional to the number of the electrode finger pairs $N_1$ and $N_3$ and the overlapping W for the electrodes 11A–11C. As the number $N_1$ and the number $N_3$ of the electrode finger pairs are set equal to each other and the overlap width W is constant in conventional SAW devices, it has been difficult to set the input impedance and the output impedance independently and as desired. Thus, conventional SAW devices have failed to meet the demand for the capability of flexibly setting the input and output impedances, while such a demand of flexible setting of the input and output impedances is particularly acute in recent compact radio apparatuses for GHz applications such as a portable or mobile telephone apparatus.

SUMMARY OF THE INVENTION

Accordingly, it is a general object of the present invention to provide a novel and useful SAW device wherein the foregoing problems are eliminated.

Another and more specific object of the present invention is to provide a SAW device capable of suppressing spurious peaks effectively outside the pass-band and simultaneously providing a sharp attenuation outside the pass-band.

Another object of the present invention is to provide a SAW device capable of setting an input impedance and an output impedance independently and flexibly.

Another object of the present invention is to provide a SAW device, comprising:

a piezoelectric substrate;

at least first and second SAW elements formed commonly on said piezoelectric substrate each along a predetermined propagation path of a surface acoustic wave on said piezoelectric substrate;

each of said first and second SAW elements including a plurality of interdigital electrodes disposed along said predetermined propagation path of said surface acoustic wave;

each of said plurality of interdigital electrodes including a primary-side electrode that in turn includes a plurality of mutually parallel electrode fingers extending in a first direction across said propagation path and a secondary-side electrode that in turn includes a plurality of mutually parallel electrode fingers extending in a second, opposite direction across said propagation path;

said electrode fingers of said primary-side electrode and said electrode fingers of said secondary-side electrode being disposed, in each of said interdigital electrodes in each of said first and second SAW elements, alternately along said propagation path so as to overlap with a predetermined overlap width when viewed in a direction of said propagating path;

said overlap width having a first value commonly in said plurality of interdigital electrodes forming said first SAW element and a second, different value commonly in said plurality of interdigital electrodes forming said second SAW element;

said first SAW element being cascaded to said second SAW element by connecting a secondary-side electrode of an interdigital electrode included in said first SAW element to a primary-side electrode of an interdigital electrode included in said second SAW element.

Another object of the present invention is to provide a SAW device, comprising:

a piezoelectric substrate;

first and second reflectors provided on said piezoelectric substrate along a propagation path of a surface acoustic wave excited on said piezoelectric substrate; and a plurality of interdigital electrodes disposed on said piezoelectric substrate consecutively from said first reflector to said second reflector;

each of said plurality of interdigital electrodes including a primary-side electrode that includes a plurality of mutually parallel electrode fingers extending in a first direction across said propagation path of said surface acoustic wave and a secondary-side electrode that includes a plurality of mutually parallel electrode fingers extending in a second, opposite direction across said propagation path of surface acoustic wave, said electrode fingers of said primary-side electrode and said electrode fingers of said secondary-side electrode being disposed, in each of said plurality of interdigital electrodes, alternately along said propagation path and overlapping with a predetermined overlap width when viewed in a direction of said propagation path of said surface acoustic wave;

said plurality of interdigital electrodes being cascaded by connecting a secondary-side electrode of an interdigital electrode to a secondary-side electrode of another interdigital electrode.

According to the present invention, it is possible to set the input impedance and output impedance of the SAW device as desired, by appropriately setting the overlap of the electrode fingers in the first SAW element and in the second SAW element or in a first interdigital electrode and a second interdigital electrode cascaded to the first interdigital electrode, without changing the pitch of the interdigital electrodes. As the pitch of the interdigital electrodes is not changed, the frequency characteristic of the SAW filter is not influenced, and only the input and output impedances are set independently and arbitrarily in the present invention according to the demand of the circuit design.

As a result of such an arbitrary setting of the input and output impedances, a number of such SAW filters can be cascaded successfully, resulting an improved suppression of spurious peaks outside the pass-band. In other words, a SAW filter having a very sharp selectivity is obtained. Further, by cascading a number of SAW filters to form a SAW filter assembly, it is possible to set the ratio between the input impedance and the output impedance of the SAW filter assembly to be a very large value not attainable by a single stage SAW filter.

Another object of the present invention is to provide a SAW device, comprising:

a package body supporting a piezoelectric substrate thereon;

at least one SAW element formed on said piezoelectric substrate;

said SAW element including a plurality of interdigital electrodes disposed along a propagation path of a surface acoustic wave on said piezoelectric substrate, each of said interdigital electrodes including an input-side interdigital electrode and an output-side interdigital electrode;

said input-side interdigital electrode being connected to a first ground pad provided on said package body;

said output-side interdigital electrode being connected to a second, different ground pad provided on said package body.

According to the present invention, the problem of interference between the ground electrode of the input-side interdigital electrode and the ground electrode of the output-side interdigital electrode is successfully eliminated, and the pass-band characteristics of the SAW device is improved substantially.

Another object of the present invention is to provide a double-mode SAW device, comprising:

a piezoelectric substrate;

first and second reflectors provided on said piezoelectric substrate along a propagation path of a surface acoustic wave on said piezoelectric substrate;

first, second and third interdigital electrodes provided on said piezoelectric substrate consecutively from said first reflector to said second reflector;

each of said first through third interdigital electrodes including first through third number of pairs of electrode fingers respectively;

wherein said first number of pairs of electrode fingers for said first interdigital electrode is different from said third number of pairs of electrode fingers for said third interdigital electrode.

According to the present invention, the symmetricity in the structure of the SAW device in the propagating direction of the SAW device is intentionally lost by setting the first and third number of pairs of the electrode fingers differently. Thereby, the surface acoustic wave reflected by the first reflector and the surface acoustic wave reflected by the second reflector cancel with each other, and the spurious peaks associated with such an interference of the reflected surface acoustic wave devices is successfully eliminated, Other objects and further features of the present invention will become apparent from the following detailed description when read in conjunction with the attached drawings.

DETAILED DESCRIPTION OF THE PREFERRED EMBODIMENTS

[FIRST EMBODIMENT]

Figure 3:
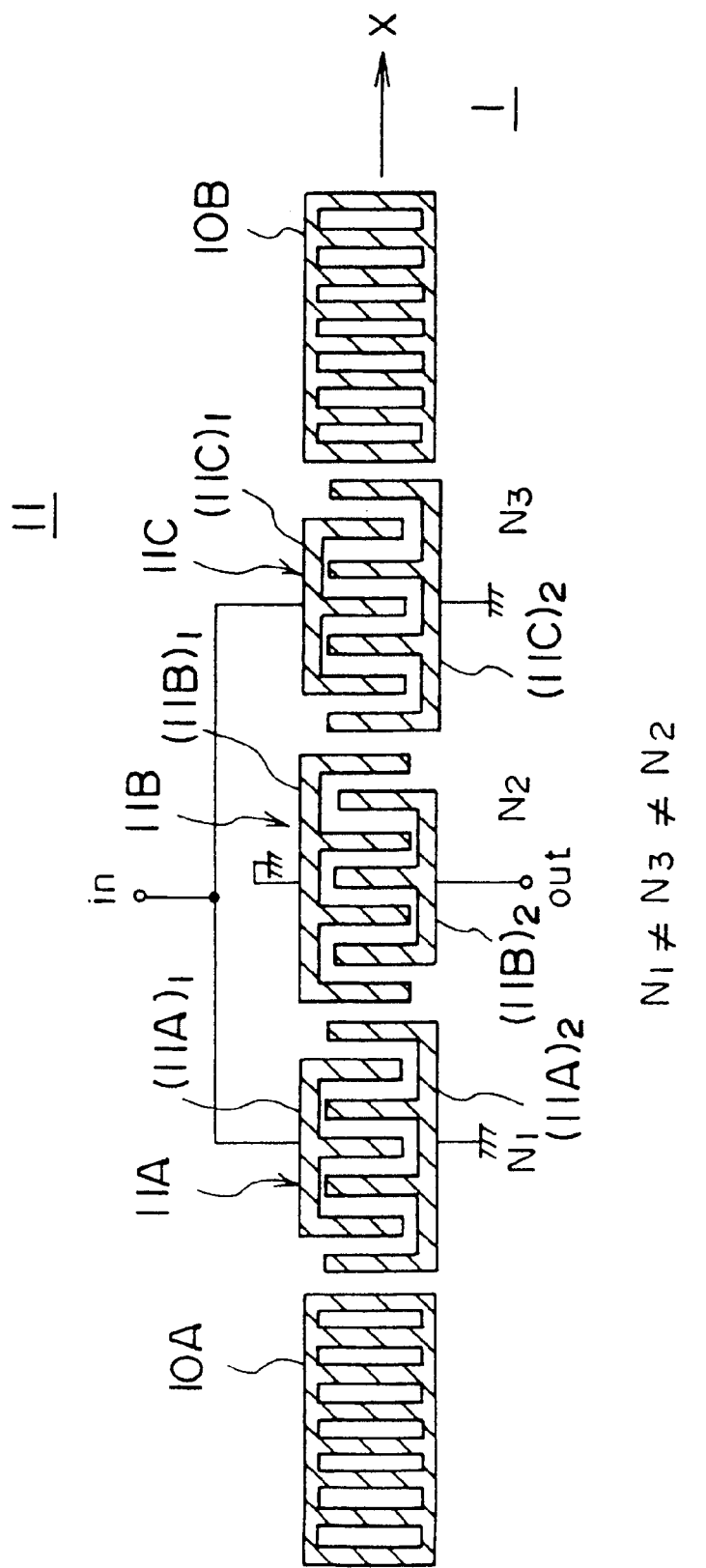
FIG. 3 is a diagram showing a construction of a SAW filter according to a first embodiment of the present invention.

First, the principle of the present invention will be described with reference to FIG. 3 showing a SAW filter 11 according to a first embodiment of the present invention, wherein those parts corresponding to the parts described previously are designated by the same reference numerals and the description thereof will be omitted.

Figures 1A, 1B:
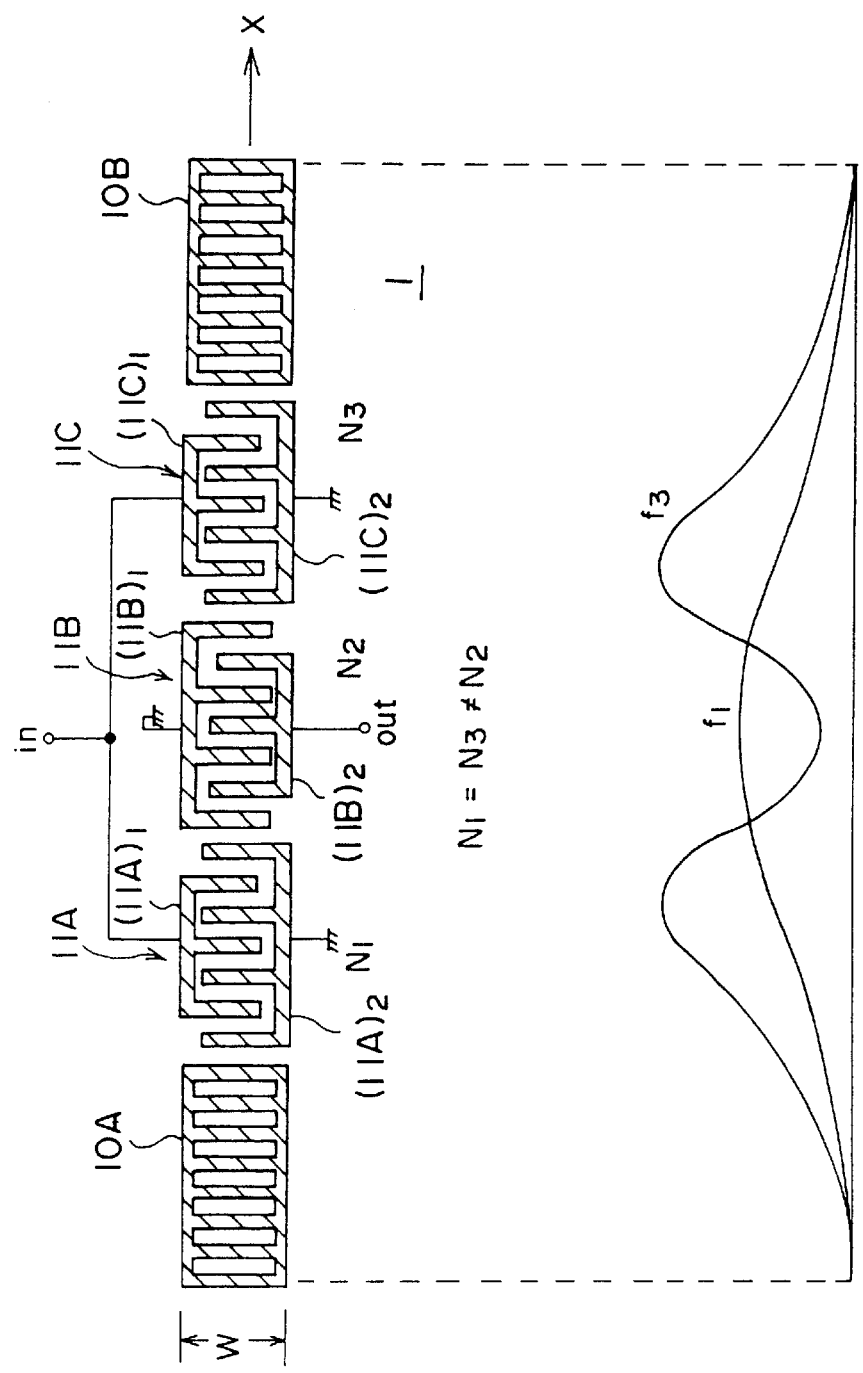
FIGS. 1A and 1B are diagrams respectively showing a construction and an operational principle of a conventional double-mode SAW filter.
Figure 2:
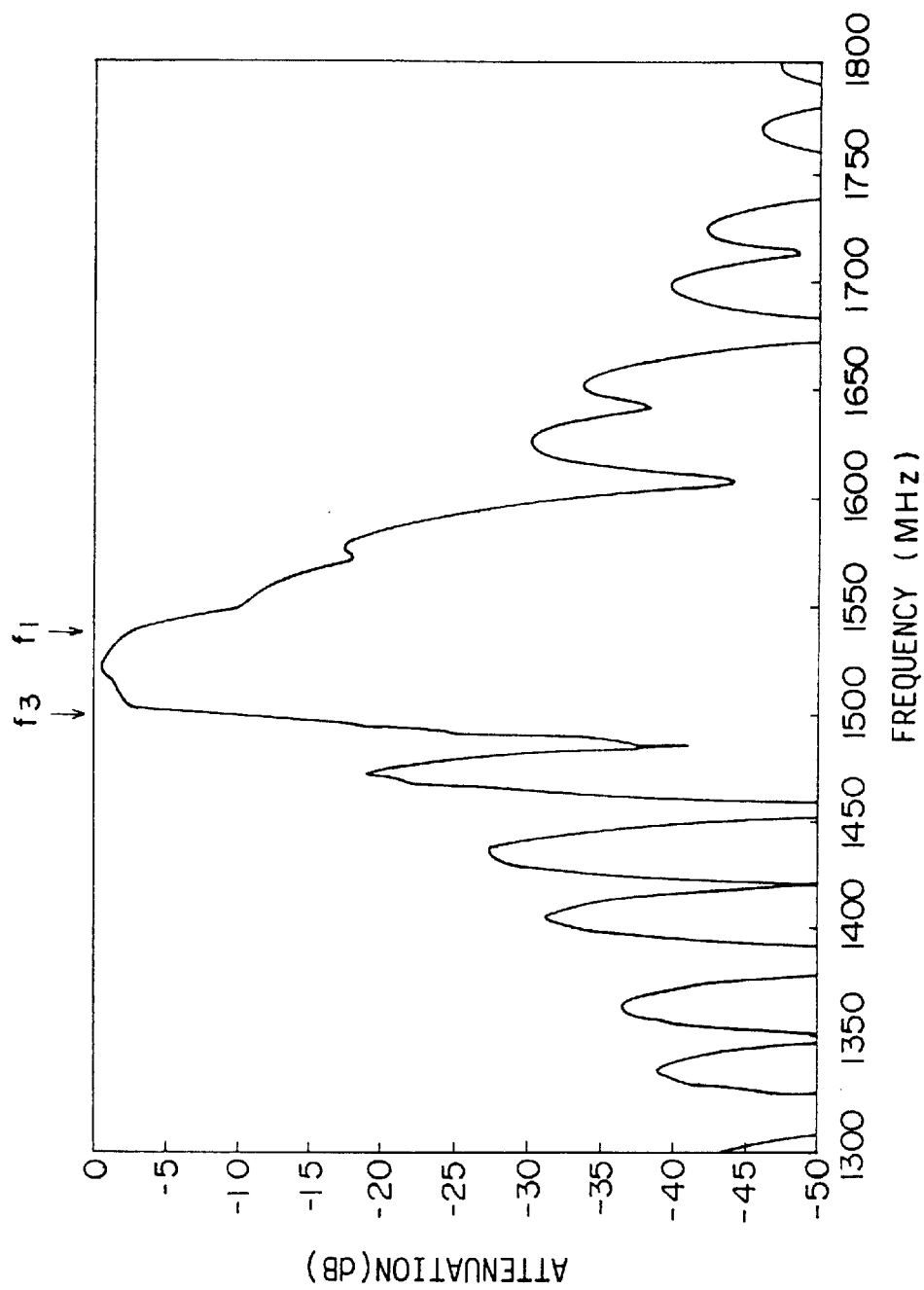
FIG. 2 is a diagram showing a theoretical frequency characteristic of the SAW filter of FIGS. 1A and 1B.

Referring to FIG. 3, the SAW filter 11 has a double-mode construction similar to the conventional SAW filter of FIG. 1A, except that the number of the electrode finger pairs $N_1$ for the interdigital electrode 11A and the number of the electrode finger pairs $N_3$ for the interdigital electrode 11C, and further the number of the electrode finger pairs $N_2$ for the interdigital electrode 11B, are changed from each other ($N_1 \neq N_3 \neq N_2$).

Figure 4:
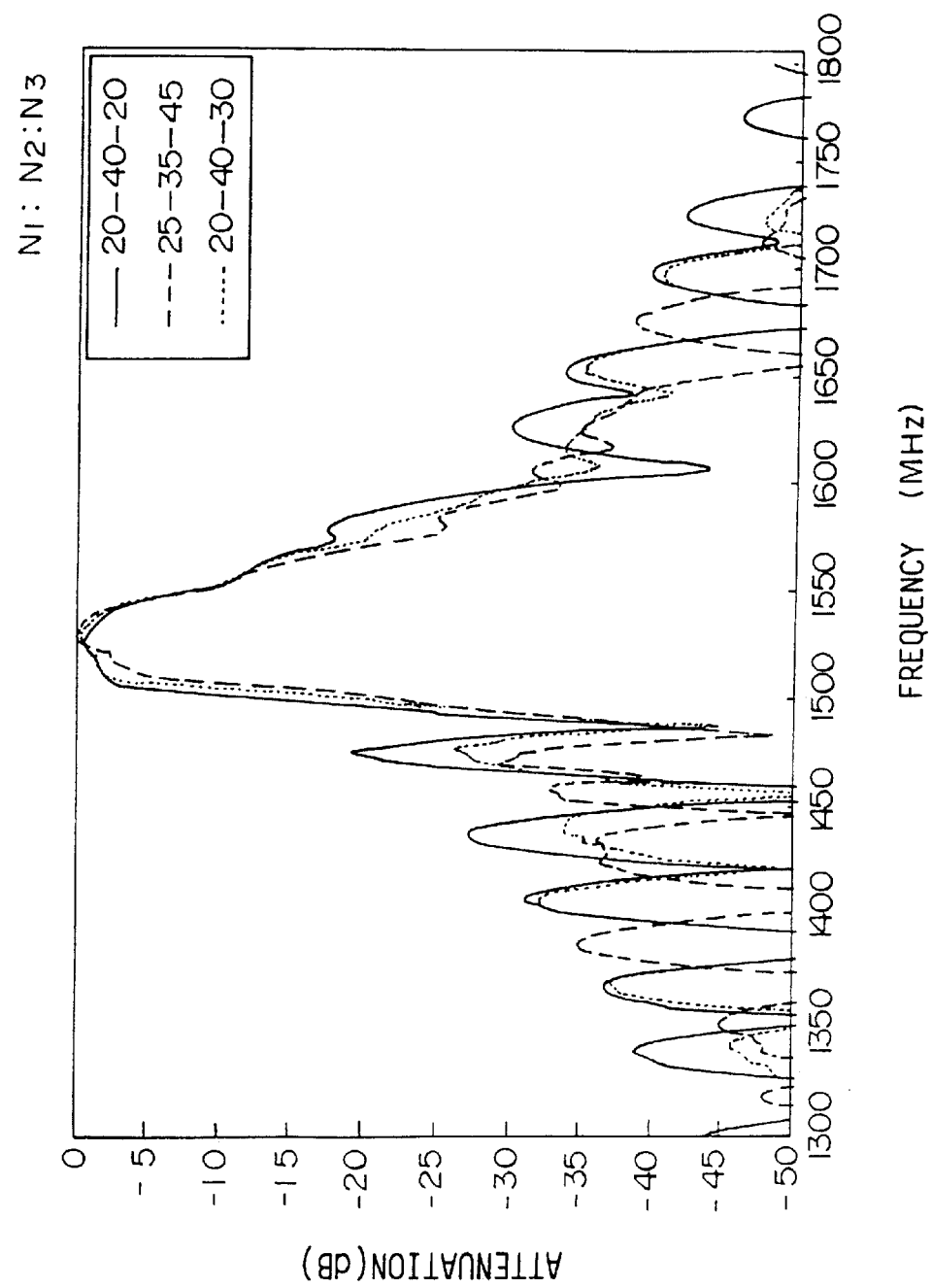
FIG. 4 is a diagram showing a theoretical frequency characteristic of the SAW filter of FIG. 3 in comparison with a corresponding theoretical frequency characteristic of the SAW filter of FIGS. 1A and 1B.

FIG. 4 shows a calculated, theoretical frequency characteristic of the SAW filter 11 of FIG. 3, wherein the continuous line of FIG. 4 indicates the result for a conventional case in which the numbers of the electrode finger pairs $N_1$, $N_2$ and $N_3$ are set respectively to 20, 40 and 20. It should be noted that a relationship $N_1 = N_3$ holds in this case. Further, the broken line of FIG. 4 indicates the result for a case in which the numbers of the electrode finger pairs $N_1$, $N_2$ and $N_3$ are set to 25, 35 and 45, respectively. In this case, a relationship $N_1 \neq N_3 \neq N_2$ holds. The dotted line of FIG. 4 indicates the result for a case in which the numbers of the electrode finger pairs $N_1$, $N_2$ and $N_3$ are set respectively to 20, 40 and 30. In this case, too, the relationship $N_1 \neq N_3 \neq N_2$ holds.

In the calculation of FIG. 4, it should further be noted that a single crystal plate of 36° Y-X $LiTaO_3$ is assumed for the substrate 1, and the calculation is made for the case in which the interdigital electrodes on the substrate 1 is formed of Al with a thickness corresponding to 8% the wavelength of the surface acoustic wave excited on the substrate 1.

In the course of investigation including such a theoretical calculation of the frequency characteristic of the SAW filter 11, the inventor of the present invention has discovered, as indicated in FIG. 4, that the height of the spurious peaks outside the pass-band decreases significantly and substantially when the numbers $N_1$ and $N_3$ of the electrode finger pairs for the interdigital electrode 11A and 11C are set asymmetric ($N_1 \neq N_3$) about the central interdigital electrode 11B. While the reason of such a suppressing of the spurious peaks is not fully understood, it is thought that such an asymmetric construction of the SAW filter 11 facilitates cancellation of the surface acoustic waves excited by the interdigital electrode 11A and returning to the interdigital electrode 11B after reflection at the reflector 10A and the surface acoustic waves excited by the interdigital electrode 11C and returning to the interdigital electrode 11B after reflection at the reflector 10B.

Figure 5:
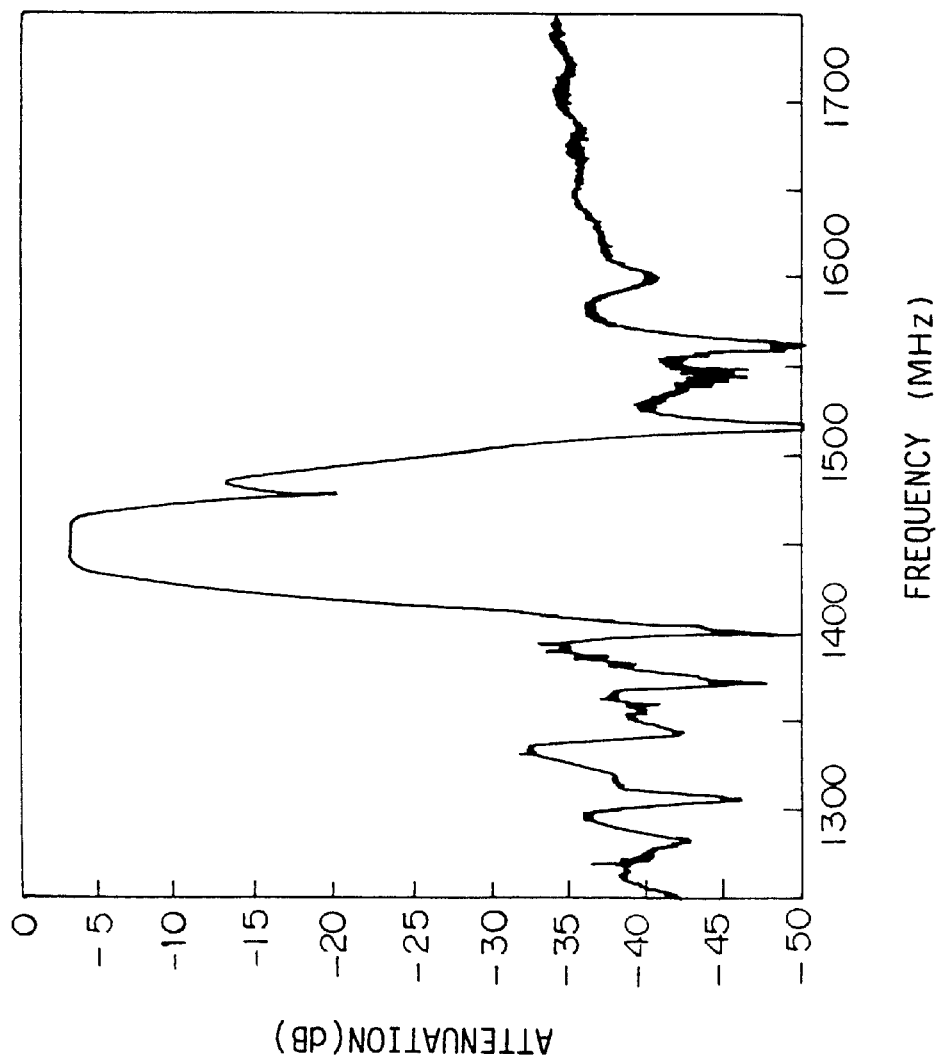
FIG. 5 is a diagram showing an observed frequency characteristic of the SAW filter of FIG. 3.

FIG. 5 shows an actually observed frequency characteristic of the SAW filter 11 of FIG. 3 for the case in which a 42° Y-X $LiTaO_3$ single crystal plate is used for the piezoelectric substrate 1 and the numbers of the electrode finger pairs $N_1$, $N_2$ and $N_3$ are set to 20, 40 and 30, respectively ($N_1:N_2:N_3=20:40:30$). In FIG. 5, it should also be noted that the interdigital electrodes 11A–11C are formed of Al with a thickness corresponding to 6% the wavelength of the surface acoustic wave excited on the substrate 1.

Figure 6:
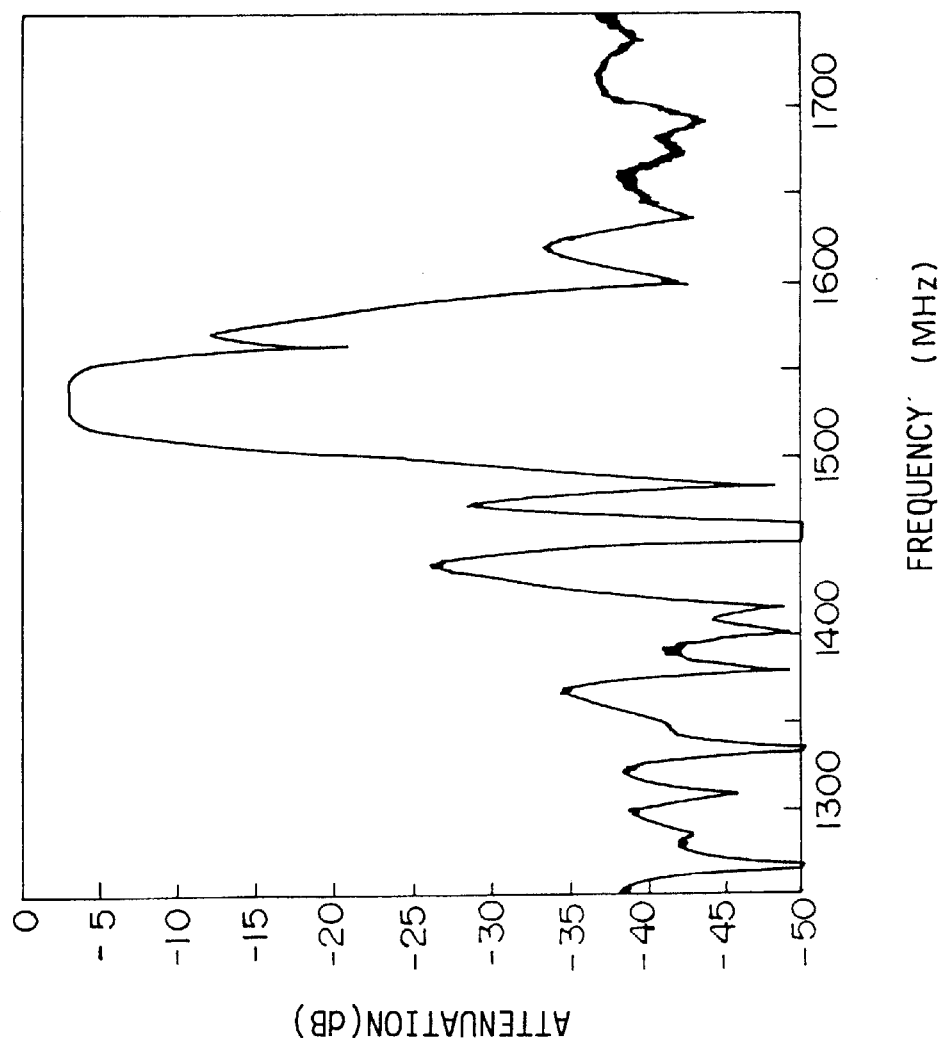
FIG. 6 is a diagram showing an observed frequency characteristic of SAW filter of FIGS. 1A and 1B.

FIG. 6, on the other hand, shows an actually observed frequency characteristic of the conventional SAW filter of FIG. 1A for the case in which a 42° Y-X $LiTaO_3$ single crystal plate is used for the piezoelectric substrate 1 similarly to the case of FIG. 5 and the numbers of the electrode finger pairs $N_1$, $N_2$ and $N_3$ are set respectively to 21, 35 and 21 ($N_1:N_2:N_3=21:35:21$). The interdigital electrodes 11A–11C are formed of Al with a thickness corresponding to 6% the wavelength of the surface acoustic wave excited on the substrate 1, similarly to the case of FIG. 5.

Referring to FIGS. 5 and 6, it should be noted that the height of the predominant spurious peaks appearing at the lower-frequency side of the pass-band in the characteristic of FIG. 6 is reduced substantially in the characteristic of FIG. 5. Further, the spurious peak appearing on the higher-frequency side of the pass-band is suppressed substantially.

It should be noted that the SAW filter 11 of the present embodiment is designed for use in a GHz band. In a SAW filter for use in such a ultra-high frequency band, it should be noted that the thickness of the interdigital electrode on the piezoelectric substrate 1 is no longer ignorable with respect to the wavelength of the excited SAW, and an added-mass effect of the electrode appears conspicuously. Such an added-mass effect causes a shift of the optimum cut angle of a $LiTaO_3$ or $LiNbO_3$ single-crystal substrate to a higher-angle side. In the case of a $LiTaO_3$ substrate, the optimum cut angle becomes 40° Y–44° Y, which is substantially higher than the conventionally used optimum cut angle of 36° Y. In the case of a $LiNbO_3$ substrate, the optimum cut angle falls in the range between 66° Y and 74° Y when the added-mass effect of the electrode is considered.

In the SAW filter 11, it should be noted that the added-mass effect appears particularly conspicuous when the thickness of the interdigital electrodes 11A–11C is in the range of 5–10% the wavelength of the excited SAW, provided that $LiTaO_3$ is used for the substrate 1 and the electrodes 11A–11C are formed of Al or an Al alloy. When $LiNbO_3$ is used for the substrate 1, on the other hand, the added-mass effect appears conspicuous when the thickness of the interdigital electrodes 11A–11C falls in the range of 4–12% the wavelength of the excited surface acoustic wave. In this case, too, use of Al or an Al-alloy is assumed for the interdigital electrodes 11A–11C.

[SECOND EMBODIMENT]

Next, a SAW filter circuit device according to a second embodiment of the present invention will be described with reference to FIG. 7, wherein those parts described previously are designated by the same reference numerals and the description thereof will be omitted.

Figure 7:
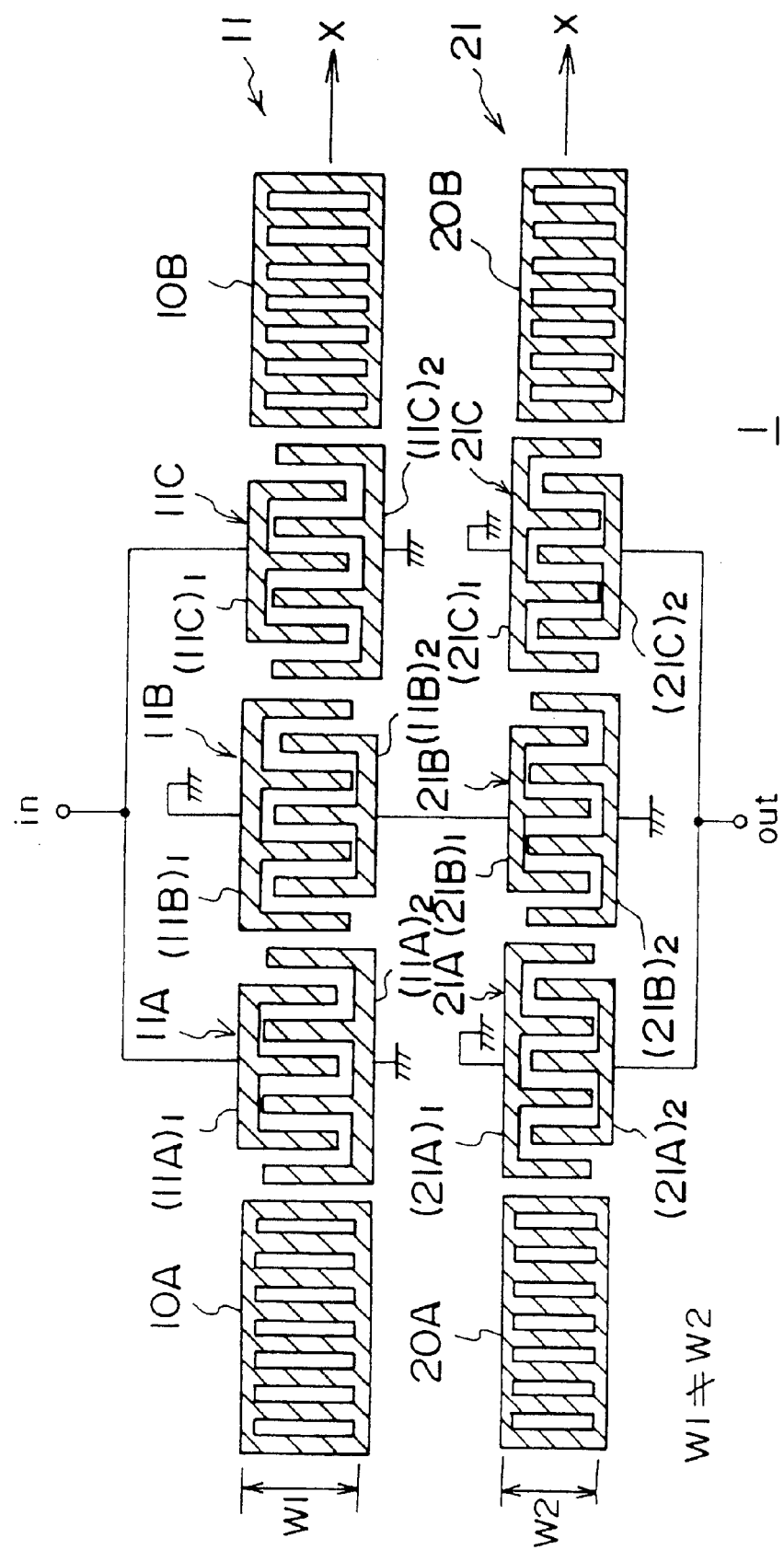
FIG. 7 is a diagram showing a construction of a SAW filter according to a second embodiment of the present invention.

Referring to FIG. 7, the SAW filter circuit device of the present embodiment is constructed on the substrate 1 of 42° Y-X $LiTaO_3$ single crystal plate and includes, in addition to the SAW filter 11, another SAW filter 21 that includes reflectors 20A and 20B aligned on the same substrate 1 in the X-direction, wherein the SAW filter 21 further includes interdigital electrodes 21A, 21B and 21C disposed consecutively from the reflector 20A to the reflector 20B. Similarly as before, the SAW filter 11 includes the reflectors 10A and 10B as well as the interdigital electrodes 11A–11C, all disposed on the same, common substrate 1.

In the construction of FIG. 7, it should be noted that the secondary-side electrode $(11B)_2$ forming a part of the interdigital electrode 11B is connected to a corresponding primary-side electrode $(21B)_1$ of the interdigital electrode 21B. Thereby, the SAW filter 11 and the SAW filter 21 are cascaded. In each of the SAW filters 11 and 21, the foregoing relationship of $N_1 \neq N_2 \neq N_3$ may hold similarly to case of the first embodiment. The present embodiment, however, includes also the case in which the foregoing relationship does not hold.

In the embodiment of FIG. 7, it should be noted that each of the primary-side electrodes $(11A)_1$ and $(11C)_1$, respectively of the interdigital electrodes 11A and 11C, are connected commonly to an input electrode pad. Further, the secondary-side electrodes $(11A)_2$ and $(11C)_2$ of the interdigital electrodes 11A and 11C as well as the primary side electrode $(11B)_1$ of the interdigital electrode 11B are grounded. Thereby, the SAW filter 11 forms a filter of a so-called dual-input single-output type. On the other hand, secondary-side electrodes $(21A)_2$ and $(21C)_2$ respectively of the interdigital electrodes 21A and 21C are connected commonly to an output electrode pad in the SAW filter 21. Further, primary-side electrodes $(21A)_1$ and $(21C)_1$ respectively of the interdigital electrodes 21A and 21C as well as a secondary-side electrode $(21B)_2$ of the interdigital electrode 21B are grounded. Thereby, the SAW filter 21 forms a filter of a single-input dual-output type.

In the embodiment of FIG. 7, the electrode fingers overlap with each other in the SAW filter 11 with an overlap width $W_1$ when viewed in the traveling direction of the surface acoustic wave in the SAW filter 11. Similarly, the electrode fingers overlap with each other in the SAW filter 21 with an overlap width $W_2$ when viewed in the traveling direction of the surface acoustic wave in the SAW filter 21, wherein the SAW filters 11 and 21 are formed such that the overlap width $W_2$ for the SAW filter 21 is different from the overlap width $W_1$ for the SAW filter 11. Thereby, the SAW filter circuit device as a whole shows an input impedance equal to the input impedance of the SAW filter 11 and an output impedance equal to the output impedance of the SAW filter 21, wherein the input impedance of the SAW filter 11 is determined by the foregoing overlap width $W_1$, while the output impedance of the SAW filter 21 is determined by the overlap width $W_2$. Thus, by setting the overlap widths $W_1$ and $W_2$ independently, it is possible to design the input impedance and the output impedance of the SAW filter circuit device independently and as desired.

Figure 8:
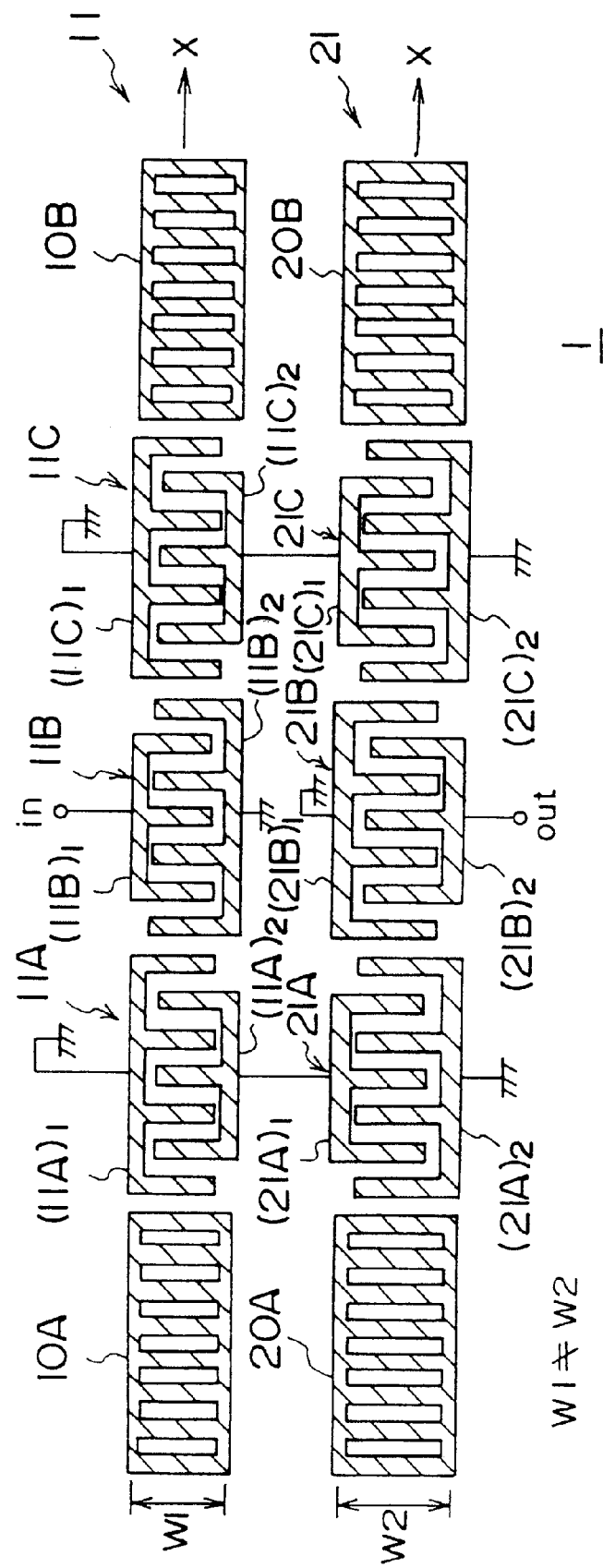
FIG. 8 is a diagram showing a modification of the SAW filter of FIG. 7.

FIG. 8 shows a modification of the SAW filter circuit device of FIG. 7, wherein those parts described previously are designated by the same reference numerals and the description thereof will be omitted.

Referring to FIG. 8, it should be noted that the primary-side electrode $(11B)_1$ of the interdigital electrode 11B is connected to an input electrode pad and the secondary-side electrode $(11B)_2$ is grounded. On the other hand, the primary-side electrodes $(11A)_1$ and $(11C)_1$ of the interdigital electrodes 11A and 11C are grounded, and the secondary-side electrodes $(11A)_2$ and $(11C)_2$ of the interdigital electrodes 11A and 11C are connected respectively to the primary-side electrode $(21A)_1$ of the interdigital electrode 21A and the primary-side electrode $(21C)_1$ of the interdigital electrode 21C. Thus, the SAW filter 11 of the embodiment of FIG. 8 has a single-input dual-output construction.

In the SAW filter 21, on the other hand, the secondary electrodes $(21A)_2$ and $(21C)_2$ of the interdigital electrodes 21A and 21C are grounded, and the output is obtained at the secondary-side electrode $(21B)_2$ of the interdigital electrode 21B. Thus, the SAW filter 21 has a dual-input single-output construction.

In the SAW filter device of FIG. 8, too, it is possible to set the input impedance and the output impedance of the SAW filter circuit device as desired, by setting the overlap width $W_1$ and the overlap width $W_2$ independently in the SAW filter 11 and the SAW filter 21.

Figure 9:
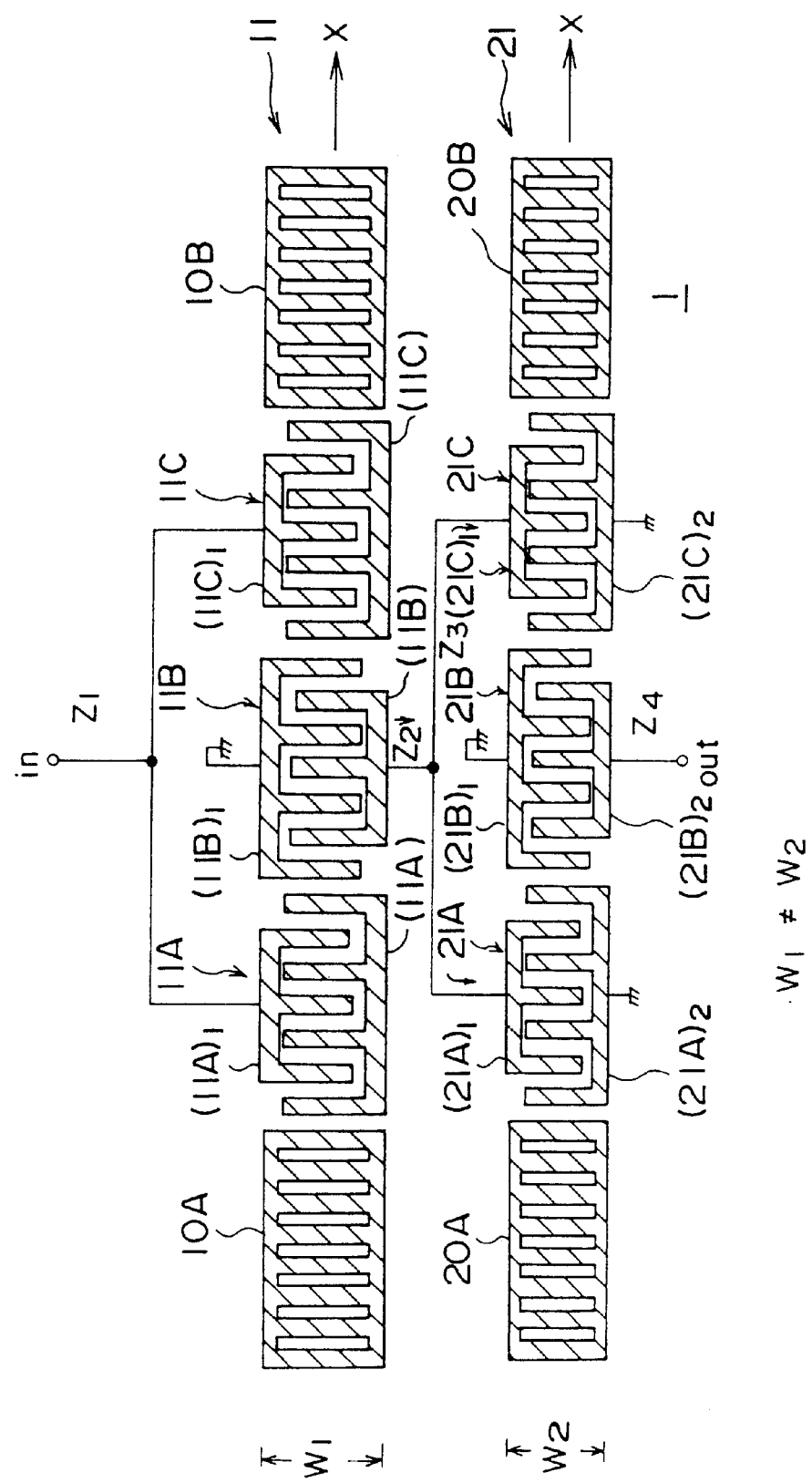
FIG. 9 is a diagram showing a further modification of the SAW filter of FIG. 7.

FIG. 9 shows a further modification of the SAW filter circuit device of FIG. 7, wherein those parts described previously are designated by the same reference numerals and the description thereof will be omitted.

Referring to FIG. 9, the SAW filter 11 has a dual-input single-output construction similarly to the embodiment of FIG. 7. Further, the SAW filter 21 has a dual-input single-output construction similarly to the embodiment of FIG. 7. Thus, the primary-side electrodes $(11A)_1$ and $(11C)_1$ of the interdigital electrodes 11A and 11C are connected commonly to an input electrode pad and the secondary-side electrodes $(11A)_2$ and $(11C)_2$ of the interdigital electrodes 11A and 11C as well as the primary-side electrode $(11B)_1$ of the interdigital electrode 11B are grounded.

In the SAW filter 21, the primary-side electrodes $(21A)_1$ and $(21C)_1$ of the interdigital electrodes 21A and 21C are connected commonly to the secondary-side electrode $(11B)_2$ of the interdigital electrode 11B, and the secondary-side electrodes $(21A)_2$ and $(21C)_2$ are grounded. Further, the secondary-side electrode $(21B)_2$ of the interdigital electrode 21B is connected to an output electrode pad. In other words, the construction of FIG. 9 includes two dual-input single-output SAW filters 11 and 21 in a cascaded connection.

In the SAW filter circuit device of FIG. 9, it should be noted that the SAW filters 11 and 21 are cascaded such that an impedance matching is established between the output side of the SAW filter 11 and the input side of the SAW filter 21, for minimizing the loss occurring as a result of such a cascaded connection.

More specifically, it is known that there holds a general relationship $$Z_1:Z_2=Z_3:Z_4$$

between the SAW filter 11 and the SAW filter 21, where $Z_1$ and $Z_2$ respectively stand for the input impedance and output impedance of the SAW filter 11, $Z_3$ and $Z_4$ respectively stand for the input impedance and output impedance of the SAW filter 21.

The present embodiment realizes an impedance matching between the SAW filters 11 and 21 as represented by a condition $$Z_2=Z_3$$

by setting the overlap widths $W_1$ and $W_2$ appropriately.

As a result, there holds a relationship between the impedances $Z_1$, $Z_2$, $Z_3$ and $Z_4$ as follows:

$$Z_2=Z_3=\sqrt{(Z_1 \cdot Z_4)}$$

In the SAW filter circuit device of FIG. 9, the overlap width $W_1$ of the SAW filter 11 is set to 60 λ while the overlap width $W_2$ of the SAW filter 21 is set to 35 λ, wherein λ represents the wavelength of the surface acoustic wave excited on the piezoelectric substrate 1 and has a value of about 4.3 μm in the present example. Further, there holds the following relationship for the SAW filters 11 and 21 in the SAW filter device of FIG. 9:

$$N_1:N_2:N_3=15:21:15$$

In this case, the SAW filter 11 has an input impedance of 50 Ω, wherein this value of the input impedance of the SAW filter 11 provides the input impedance of the cascaded SAW filter circuit device of FIG. 9. Further, the SAW filter 21 thus configured has an output impedance of 150 Ω, wherein this output impedance of the SAW filter 21 provides the output impedance of the cascaded SAW filter circuit device.

In the SAW filter circuit device of FIG. 9 where there exists an impedance matching between the cascaded SAW filters 11 and 21, it is possible to increase the number of the cascaded stages further, such that the output impedance of the SAW filter circuit device becomes very much larger than or very much smaller than the input impedance of the same SAW filter circuit device.

Further, it should be noted that such a cascaded SAW filter circuit device, which may include many cascaded SAW filters therein, is extremely effective for suppressing the spurious peaks outside the pass-band and for improving the selectivity of the filter.

Figure 10:
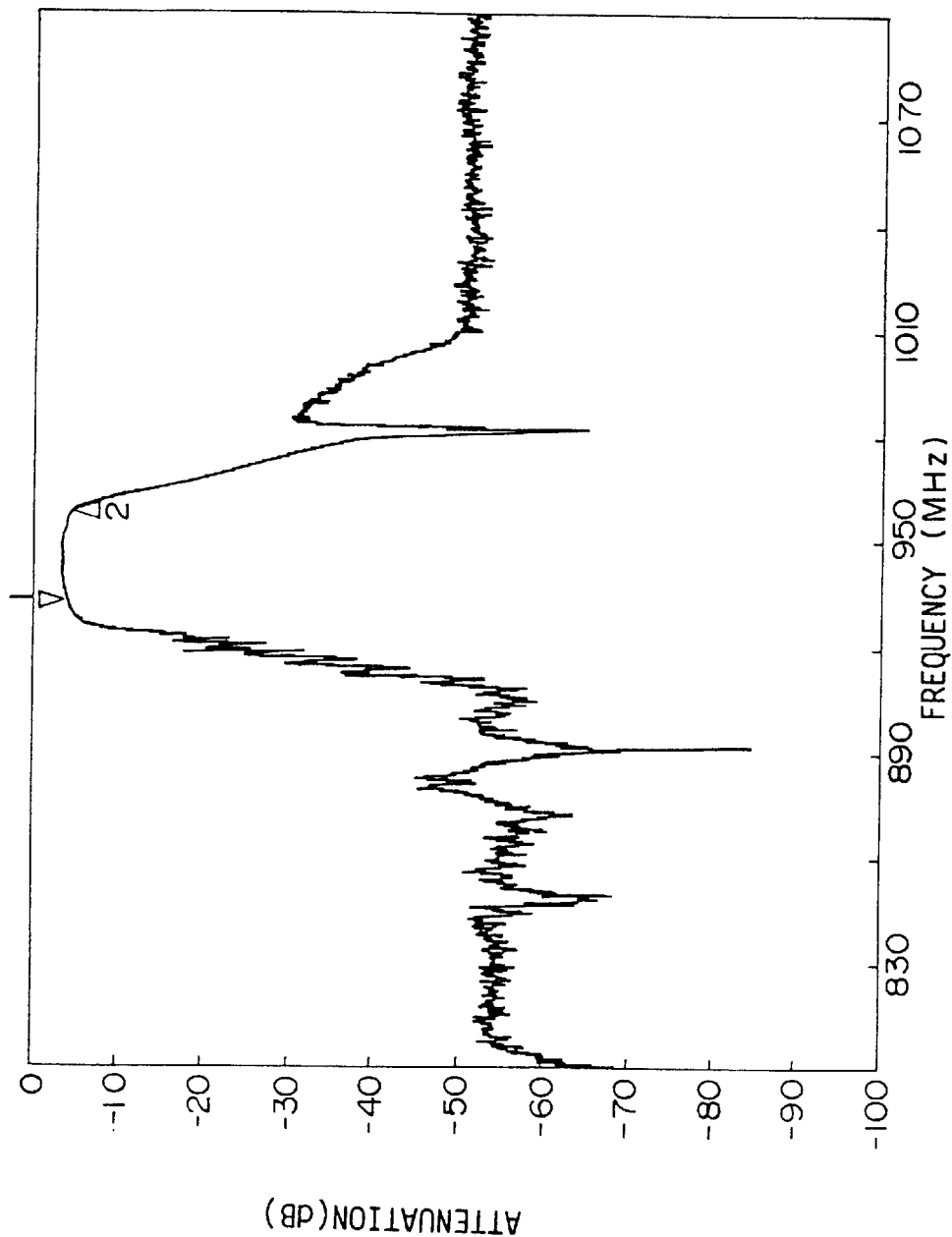
FIG. 10 is a diagram showing a frequency characteristic of the SAW filter of FIG. 9.

FIG. 10 shows the pass-band characteristic of the cascaded SAW filter circuit device of FIG. 9 for the case in which the input side is terminated by a resistance of 50 Ω and the output side is terminated by a resistance of 150 Ω.

Referring to FIG. 10, it will be understood that the spurious peaks outside the pass-band are effectively suppressed by cascading the SAW filters 11 and 21 as such. In other words, FIG. 10 indicates clearly that an effect of suppressing spurious peaks similarly to the effect achieved by the SAW filter of the first embodiment, is achieved also in the present embodiment.

[THIRD EMBODIMENT]

Figure 11:
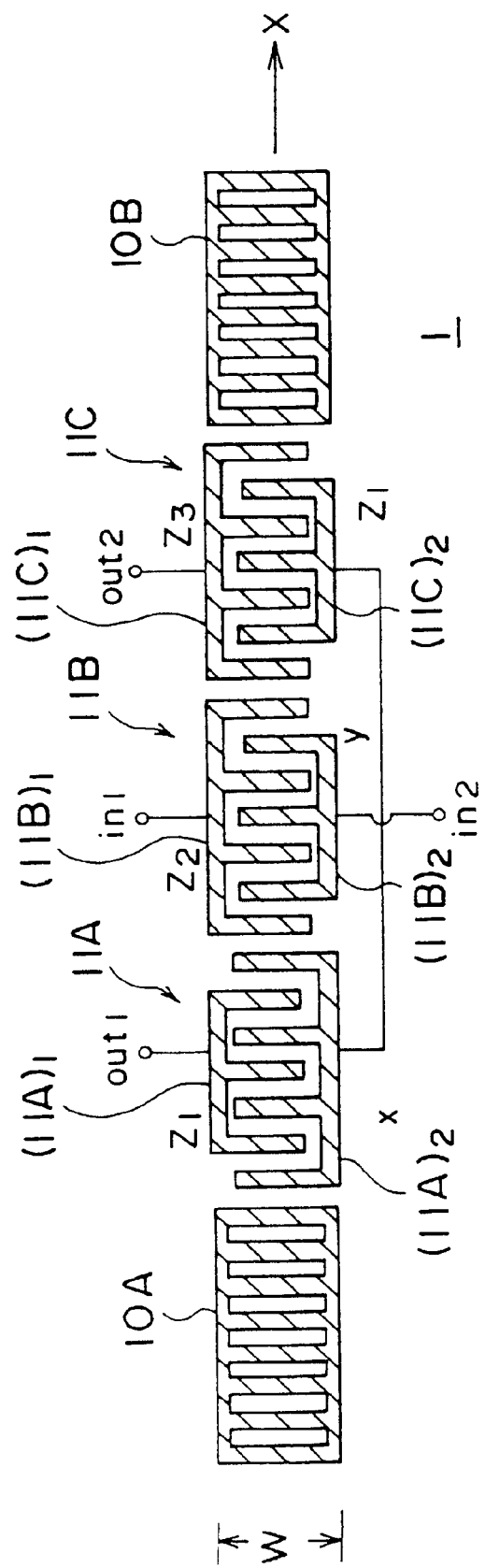
FIG. 11 is a diagram showing a construction of a SAW filter according to a third embodiment of the present invention.

FIG. 11 shows the construction of a SAW filter according to a third embodiment of the present invention, wherein those parts described previously are designated by the same reference numerals and the description thereof will be omitted.

In the present embodiment, the input impedance and the output impedance are changed for a single SAW filter.

Referring to FIG. 11, it should be noted that the primary-side electrode $(11B)_1$ of the interdigital electrode 11B is connected to a first input electrode pad while the secondary-side electrode $(11B)_2$ of the interdigital electrode 11B is connected to a second input electrode pad. Thus, the SAW filter of FIG. 11 operates as a differential filter device when different input signals are supplied respectively to the foregoing primary-side electrode $(11B)_1$ and the secondary-side electrode $(11B)_2$. Alternatively, the electrode $(11B)_2$ may be grounded.

In the SAW filter of FIG. 11, the secondary-side electrode $(11A)_2$ and the secondary side electrode $(11C)_2$ are connected to each other, and the primary-side electrode $(11A)_1$ of the interdigital electrode 11A is connected to a first output electrode pad, the primary-side electrode $(11C)_1$ of the interdigital electrode 11C is connected to a second output terminal. Thereby, the interdigital electrode 11A and the interdigital electrode 11C are cascaded. The electrode $(11A)_1$ and the electrode $(11C)_1$ may be grounded.

In the construction of FIG. 11, it should be noted that the interdigital electrodes 11A–11C have a common overlap width W for the electrode fingers. Even in such a construction, the output impedance of the SAW filter as a whole is provided by a sum of an output impedance $Z_1$ of the interdigital electrode 11A and an output impedance $Z_3$ of the interdigital electrode 11C. In other words, the construction of FIG. 11 allows an adaptation of the output impedance of the SAW filter as a whole with respect to the input impedance, although the degree of freedom of such an adjustment is limited somewhat as compared with the previous embodiment. In the SAW filter of FIG. 11, the input impedance is provided by the input impedance $Z_2$ of the interdigital electrode 11B.

[FOURTH EMBODIMENT]

Figure 12:
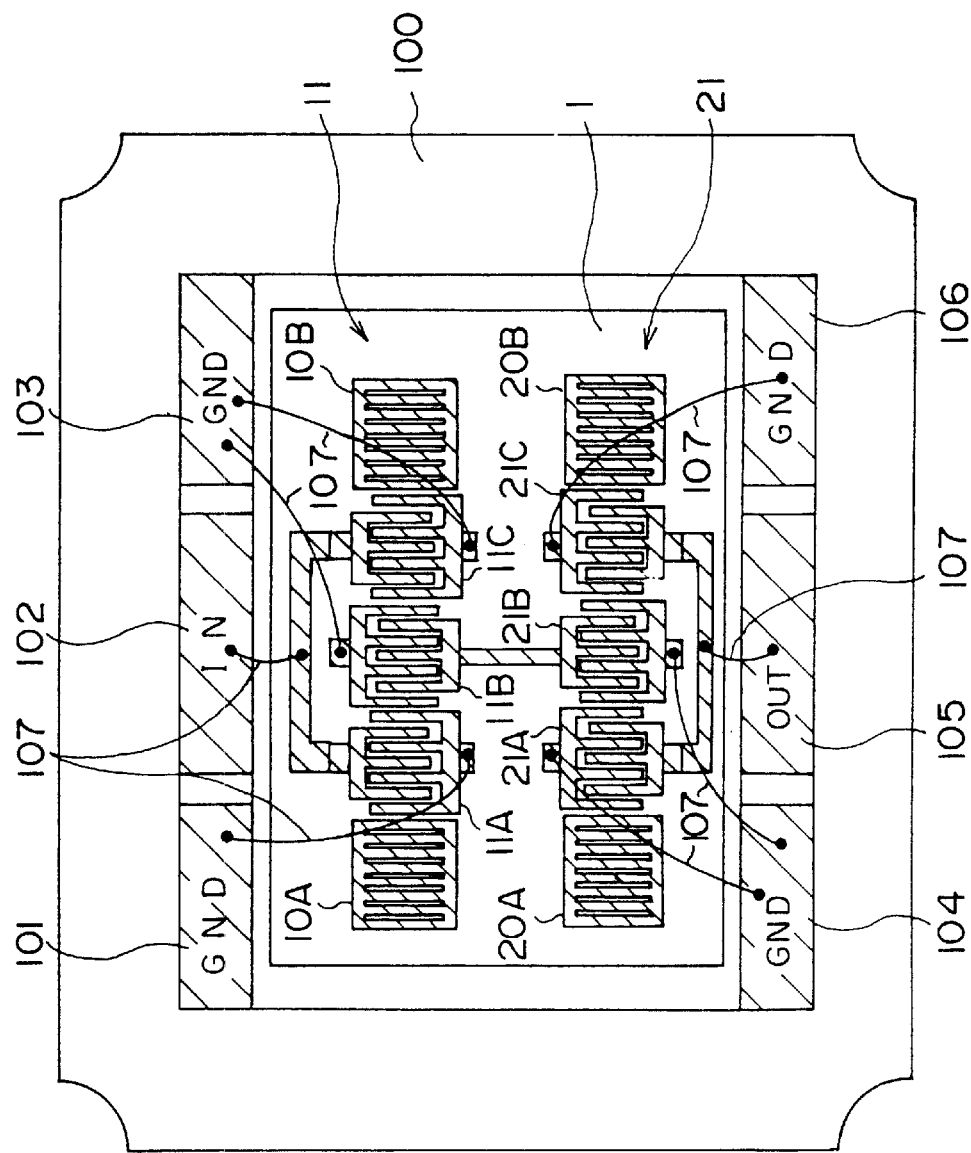
FIG. 12 is a diagram showing a construction of a SAW filter according to a fourth embodiment of the present invention.

FIG. 12 shows a construction of a SAW filter according to a fourth embodiment of the present invention including a package, wherein those parts described previously are designated by the same reference numerals and the description thereof will be omitted.

Referring to FIG. 12, the piezoelectric substrate 1 carrying thereon a SAW filter similar to the SAW filter of FIG. 7 is held on a ceramic package body 100, wherein the package body 100 carries thereon ground electrode pads 101 and 103 at a first side thereof together with an input electrode pad 102 such that the ground electrode pads 101 and 103 are located at both lateral sides of the input electrode pad 102. Similarly, the package body 100 carries thereon ground electrode pads 104 and 106 on a second, opposite side thereof together with an output electrode pad 105 such that the ground electrode pads 104 and 106 are located at both lateral sides of the output electrode pad 105.

In the construction of FIG. 12, the ground electrode of the interdigital electrode 11A corresponding to the electrode $(11A)_2$ of FIG. 7 is connected to the ground electrode pad 101 on the package body 100 by an Al wire 107. Further, the ground electrode of the interdigital electrode 11C corresponding to the electrode $(11C)_2$ of FIG. 7 is connected to the ground electrode pad 103 on the package body 100 by another Al wire 107. Similarly, the ground electrode of the interdigital electrode 11B corresponding to the electrode $(11B)_1$ of FIG. 7 is connected to the foregoing ground electrode 103 by a still another Al wire 107. Further, the output electrodes of the interdigital electrodes 11A and 11C corresponding to the electrodes $(11A)_1$ and $(11C)_1$ are connected commonly to the input electrode pad 102 disposed between the ground electrode pad 101 and the ground electrode pad 103 by way of respective Al wires 107.

In the SAW filter 21 formed also on the same piezoelectric substrate 1, it should be noted that the ground electrode of the interdigital electrode 21A corresponding to the electrode $(21A)_1$ of FIG. 7 is connected to the ground electrode pad 104 on the package body 100 by another Al wire 107. Further, the ground electrode of the interdigital electrode 21C corresponding to the electrode $(21C)_1$ of FIG. 7 is connected to the ground electrode pad 106 on the package body 100 by still another Al wire 107. Further, the ground electrode of the interdigital electrode 21B corresponding to the electrode $(21B)_2$ of FIG. 7 is connected to the ground electrode pad 104 by another Al wire 107. Further, the output electrodes of the interdigital electrodes 21A and 21C corresponding to the electrodes $(21A)_2$ and $(21C)_2$ are connected commonly to the output electrode pad 105 provided between the foregoing ground electrode pads 104 and 106 by means of another Al wire 107. Furthermore, the SAW filter 11 and the SAW filter 21 are cascaded by connecting the secondary-side electrode $(11B)_2$ of the interdigital electrode 11B to the primary-side electrode $(21B)_1$ of the interdigital electrode 21B.

Generally, electrodes provided on a ceramic package more or less form a capacitive coupling with each other, while the present invention avoids the problem associated with such a capacitive coupling of the electrodes by disposing the input-side ground electrode pads 101 and 103 on the first edge of the package body 100 and the output-side ground electrode pads 104 and 106 on the second, opposite edge of the package body 100. By disposing the ground electrodes as such, it is possible to avoid interference between the input-side ground electrode pads and the output-side ground electrode pads, and the selectivity of the SAW filter as a whole is improved. In the construction of FIG. 12, it should further be noted that the ground electrode pads 101 and 103 are separated and the ground electrode pads 104 and 106 are separated for further suppressing of the interference.

Figure 13:
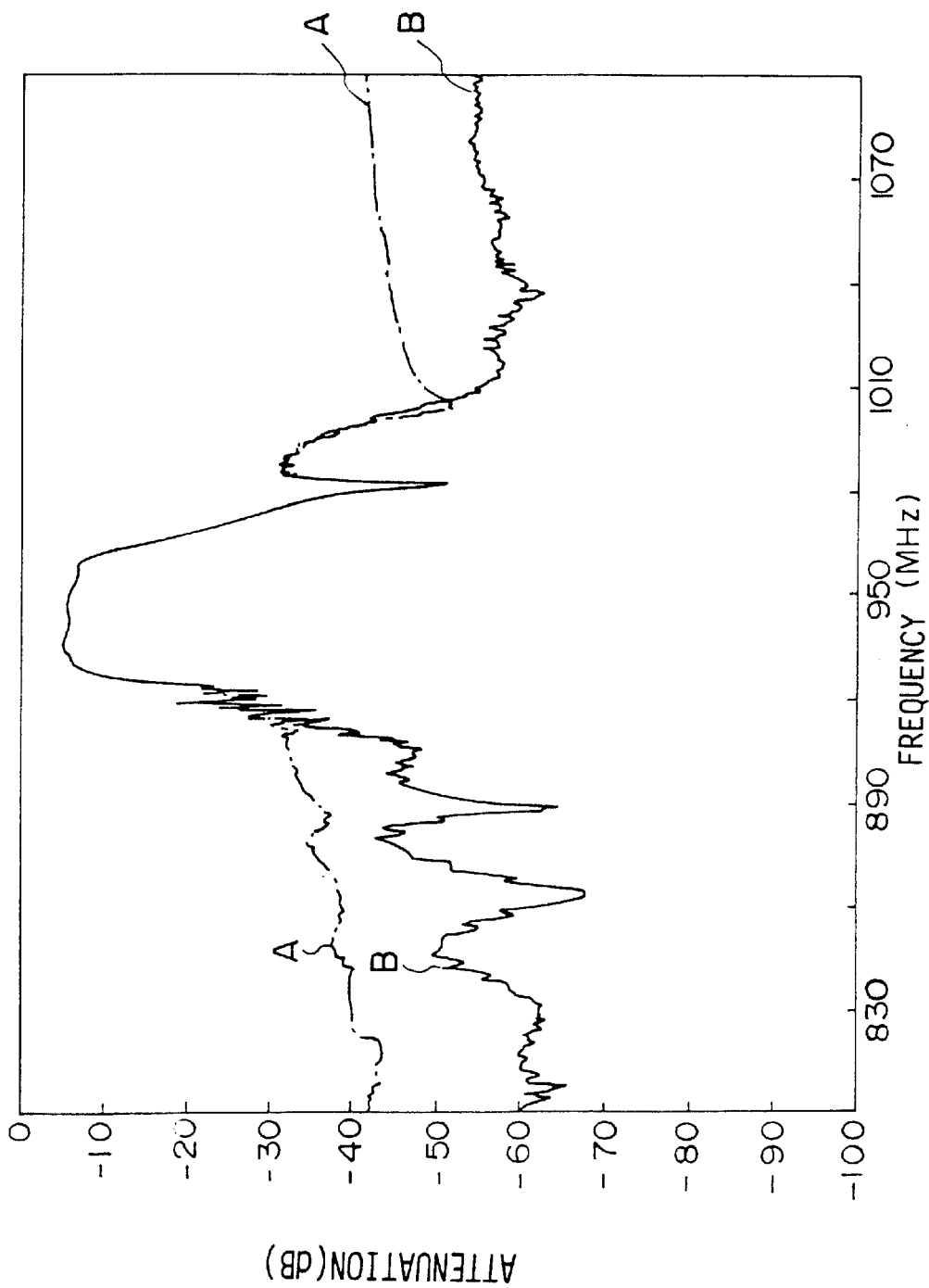
FIG. 13 is a diagram showing a frequency characteristic of the SAW filter of FIG. 12.

FIG. 13 shows the pass-band characteristic of the SAW filter of FIG. 12 for the case in which the ground connections of the SAW filters 11 and 21 are made both to the input side where the ground electrode pads 101 and 103 are provided and the output side where the ground electrode pads 104 and 106 are provided.

Referring to FIG. 13 showing characteristic curves A and B, the characteristic curve B represents the pass-band characteristic for the SAW filter of FIG. 12 as it is, while the characteristic curve A represents the pass-band characteristic of the SAW filter of FIG. 12 for the case in which the secondary-side electrodes $(11C)_2$ and $(11A)_2$ of the interdigital electrodes 11A and 11C are connected respectively to the ground electrode pads 101 and 104 and further to the ground electrode pads 103 and 106 by respective Al wires 107. Similarly, the secondary-side electrodes $(21C)_2$ and $(21A)_2$ of the interdigital electrodes 21A and 21C are connected respectively to the ground electrode pads 101 and 104 and further to the ground electrode pads 103 and 106 by respective Al wires 107 in the case of the characteristic curve A.

As will be seen clearly from FIG. 13, the suppression of spurious peaks outside the pass-band of the SAW filter is deteriorated in the case of the characteristic curve A, indicating the effectiveness of the construction of FIG. 12 that provides the characteristic curve B.

[FIFTH EMBODIMENT]

A SAW filter is used generally in the form of a package in which the SAW filter is accommodated in a package body. Thus, the package of the SAW filter also requires an improvement, particularly with respect to a metal protective cap used in the package for protecting the SAW device accommodated therein.

Figure 14:
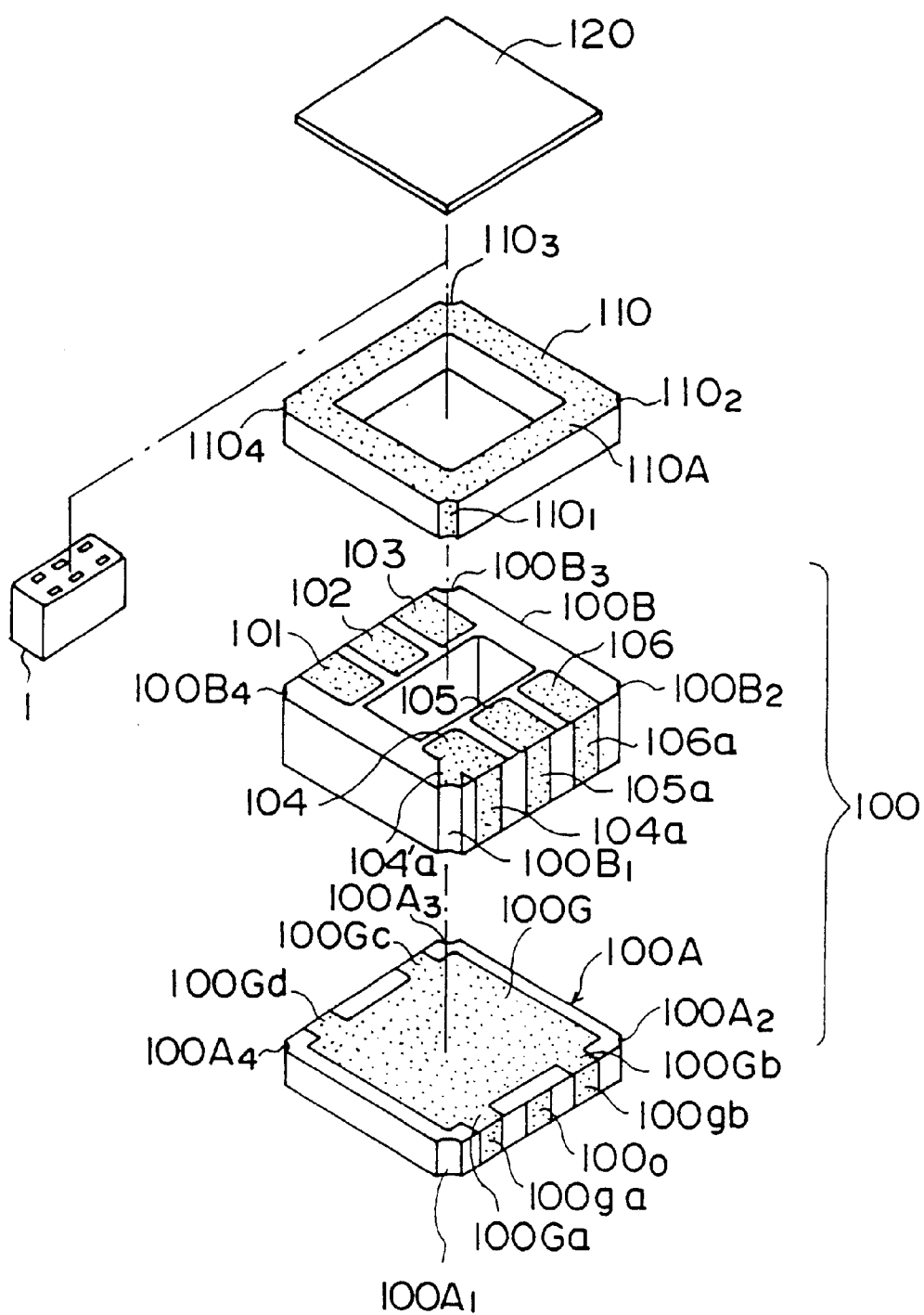
FIG. 14 is a diagram showing the construction of the SAW filter of FIG. 12 including a metal cap in an exploded state.

FIG. 14 shows a fifth embodiment of the present invention directed to such an improvement of the package, wherein FIG. 14 shows the package that accommodates the SAW filter of FIG. 12 in an exploded state. In FIG. 14, those parts described previously are designated by the same reference numerals and the description thereof will be omitted.

Referring to FIG. 14, the package includes a package body corresponding to the package body 100 of FIG. 12, wherein the package body 100 in turn is formed of a base 100A and a holder piece 100B provided on the base 100A, wherein the holder piece 100B is formed with a central opening for accommodating therein a SAW filter which may have a construction of FIG. 12, for example. Further, the SAW package includes a spacer member 110 provided on the foregoing package body 100, and a metal cap 120 is provided on the spacer member 110 thus provided on the package body 100 for protecting the SAW filter held in the package body 100.

It should be noted that the base 100A of the package body 100 is formed with chamfered surfaces $100A_1$, $100A_2$, $100A_3$ and $100A_4$ at four corners thereof and a ground electrode 100G is formed on the top surface as indicated in FIG. 14, wherein the ground electrode 100G extends in the direction of the output-side edge in the form of electrode leads 100Ga and 100Gb. Further, electrodes leads 100*ga* and 100*gb* extend in a downward direction on the side wall of the base 100A respectively from the electrode leads 100Ga and 100Gb. Similarly, electrode leads 100Gc and 100Gd extend from the ground electrode 100G toward the input-side edge of the base 100A, and electrodes 100*gc* and 100*gd* not shown in FIG. 14 extend respectively from the electrode leads 100Gc and 100Gd on the side wall of the base 100A in the downward direction similarly to the electrode leads 100*ga* and 100*gb*.

The base 100A carries thereon the piezoelectric substrate 1 of the SAW filter, and the holder piece 100B is mounted upon the base 100A as noted before, such that the SAW filter on the base 100A is accommodated in the central opening formed in the holder piece 100B. Thereby, the piezoelectric substrate 1 is adhered to a part of the ground electrode 100G exposed by the central opening of the holder piece 100B.

The holder piece 100B is formed with chamfered surfaces $100B_1$–$100B_4$ at four corners thereof respectively corresponding to the chamfered surfaces $100A_1$–$100A_4$, and the electrode pads 101–103 are formed on the top surface of the holder piece 100B along an input-side edge as indicated in FIG. 14. Similarly, the electrode pads 104–106 are formed on the top surface of the holder piece 100B along an output-side edge.

Further, electrode leads 104a, 105a and 106a extend on the side wall of the holder piece 100B respectively from the electrodes 104–106 in the downward direction, wherein the electrode lead 104a is connected to the electrode lead 100ga on the side wall of the base 100A. Similarly, the electrode lead 106a is connected to the electrode lead 100gb, and the electrode lead 105a is connected to an electrode lead 100o provided on the side wall of the base 100A between the electrode leads 100ga and 100gb. Similar electrode leads are formed also on the input-side of the holder piece 100B in correspondence to the electrode pads 101–103.

The spacer member 110 has a ring-shaped form and exposes a part of the electrode pads 101–106 as well as a part of the piezoelectric substrate 1, wherein it will be noted from FIG. 14 that the spacer member 110 includes chamfered surfaces $110_1$–$110_4$ respectively corresponding to the chamfered surfaces $100B_1$–$100B_4$ of the holder piece 100B. The spacer member 100 carries thereon a ground electrode 110A, and the metal cap 120 is brazed upon the ground electrode 110A thus formed on the spacer member 110.

It should be noted that the ground electrode 110A includes a ground lead extending on the chamfered surface $110_1$ in the downward direction, wherein the ground lead is connected to a corresponding ground lead 104a' extending from the ground electrode pad 104 on the holder piece 100B to the chamfered surface $100B_1$, upon mounting of the spacer member 110 on the holder piece 100B. In other words, the metal cap 120 is connected to the ground electrode pad 104 alone and not to other ground electrode pads 101, 103 or 106. By configuring the package structure as such, it is possible to avoid the problem of deterioration of the SAW filter pass-band characteristic caused by the interference of ground electrode pads explained with reference to FIG. 13.

Figure 15:
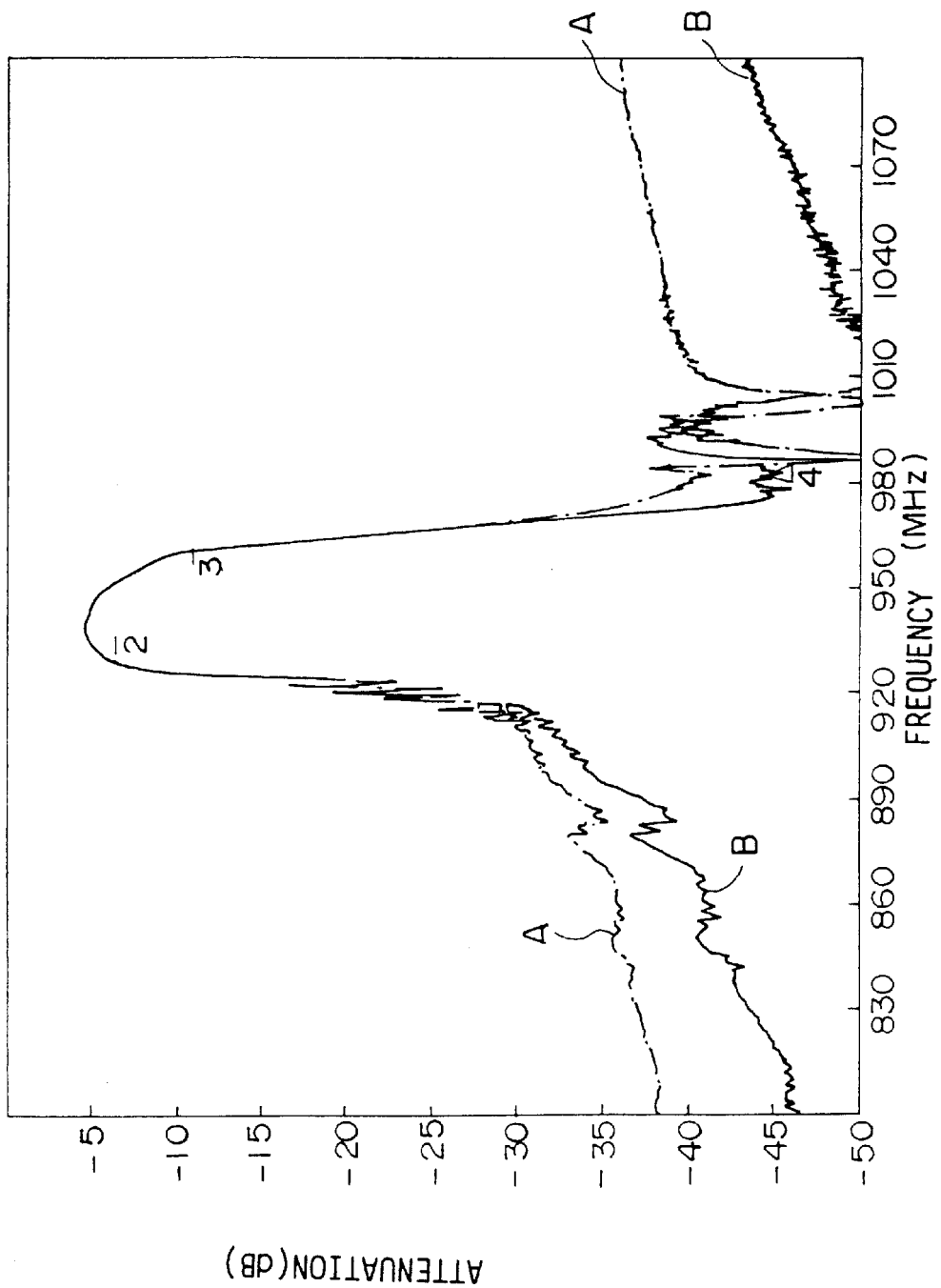
FIG. 15 is a diagram showing a frequency characteristic of the SAW filter of FIG. 14.

FIG. 15 shows the pass-band characteristic of the SAW filter of FIG. 14.

Referring to FIG. 15 showing characteristic curves A and B, it should be noted that the characteristic curve B indicates the pass-band characteristic of the SAW filter of FIG. 14, while the characteristic curve A indicates the pass-band characteristic of the SAW filter in which the metal cap 120 is grounded at all of the four corners thereof in the construction of FIG. 14.

As will be seen clearly in FIG. 15, the spurious level outside the pass-band increases substantially in the case the metal cap 120 is grounded at all the four corners thereof as compared with the case of FIG. 14 in which the metal cap 120 is grounded only at one corner thereof. The result of FIG. 15 clearly demonstrates the existence of interference between different ground electrode pads acting over the metal cap 120.

[SIXTH EMBODIMENT]

Figure 16:
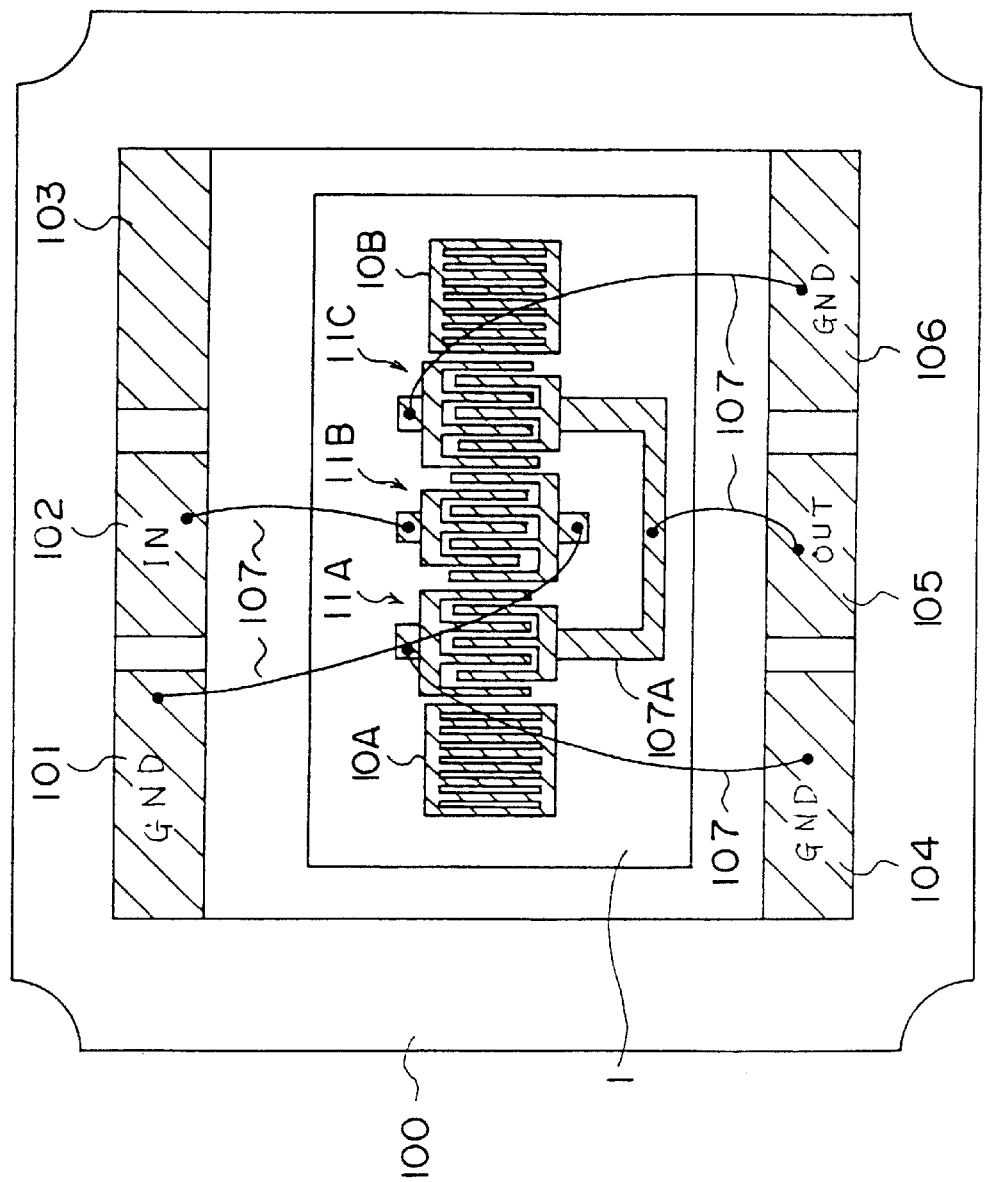
FIG. 16 is a diagram showing a construction of a SAW filter according to a sixth embodiment of the present invention.

FIG. 16 shows the construction of a SAW filter according to a sixth embodiment of the present invention including the package body, wherein the SAW filter of FIG. 16 is a modification of the SAW filter of FIG. 12. Thus, the parts of the SAW filter of FIG. 16 corresponding to those of FIG. 12 are designated by the same reference numerals and the description thereof will be omitted.

Referring to FIG. 16, the piezoelectric substrate 1 held on the package body 100 carries thereon only the SAW filter 11 or 21. Thereby, the interdigital electrodes 11A and 11C of the output-side are grounded at the output-side ground electrode pads 104 and 106 respectively. Further, the interdigital electrode 11B of the input-side is grounded at the input-side ground electrode pad 101. In the SAW filter of FIG. 16, it should be noted that an input signal is supplied also to the ground electrode pad 101. Thereby, the SAW filter of FIG. 16 operates as a differential type filter.

In the SAW filter of FIG. 16, the interaction of the input-side ground pad and the output-side ground pad via the capacitive coupling is successfully and effectively eliminated, and an excellent pass-band characteristic similar to the one shown in FIG. 12 is obtained.

[SEVENTH EMBODIMENT]

Figure 17:
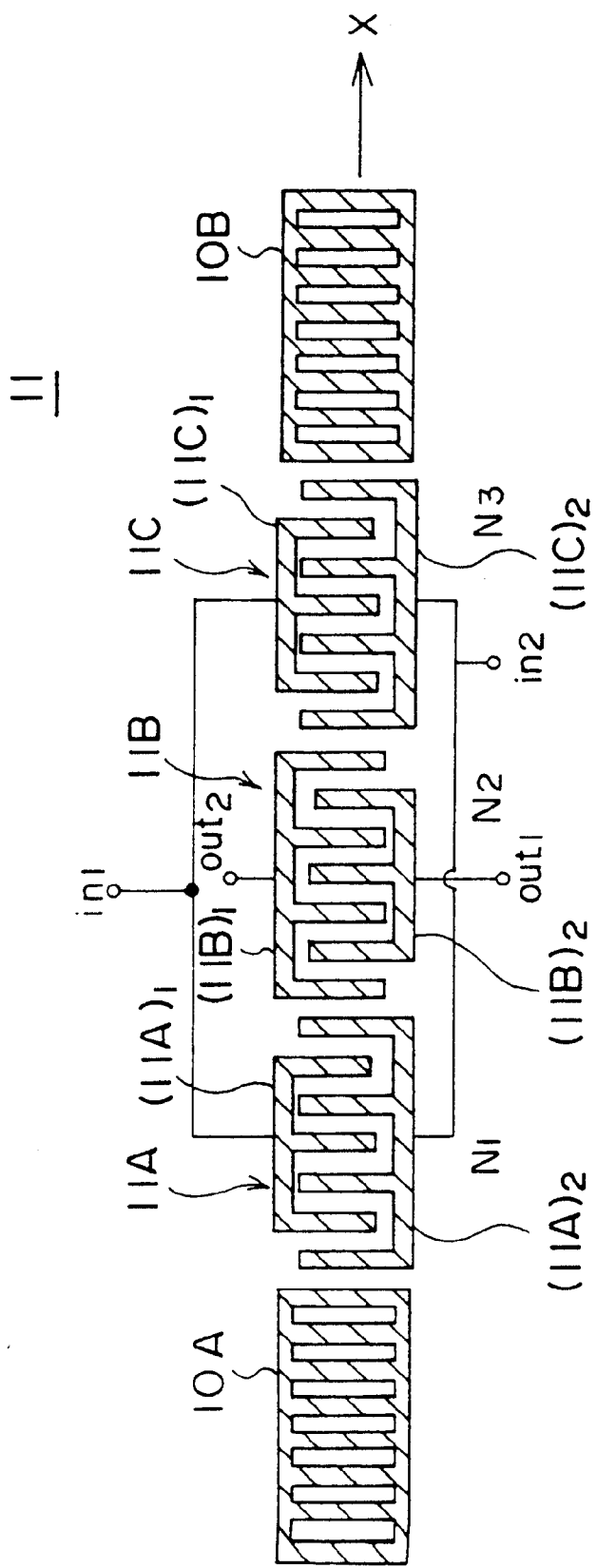
FIG. 17 is a diagram showing a construction of a SAW filter according to a seventh embodiment of the present invention.

FIG. 17 shows the construction of a SAW filter according to a seventh embodiment of the present invention, wherein those parts described previously with reference to preceding drawings are designated by the same reference numerals and the description thereof will be omitted.

Similarly to the SAW filter of FIG. 16, the SAW filter of the present embodiment can be used also as a differential type filter, by supplying an input signal not only to the input electrode pad but also to the ground electrode pad. Thus, the SAW filter of FIG. 16 has the secondary-side electrodes $(11A)_2$ and $(11C)_2$ of the interdigital electrodes 11A and 11C not grounded but supplied with a second input signal $IN_2$ different from a first input signal $IN_1$ which is supplied to the primary-side electrodes $(11A)_1$ and $(11C)_1$ of the interdigital electrodes 11A and 11C. Thereby, it should be noted that primary-side electrode $(11B)_1$ of the interdigital electrode 11B is not grounded but produces an output signal $OUT_2$ that is different from an output signal $OUT_1$ obtained at the secondary-side electrode $(11B)_2$ of the interdigital electrode 11B.

In the construction of FIG. 17, it should be noted that the relationship $$N_1 \neq N_2 \neq N_3$$

holds between the numbers $N_1$, $N_2$ and $N_3$ of the electrode finger pairs, similarly to the embodiment of FIG. 3.

Figure 18:
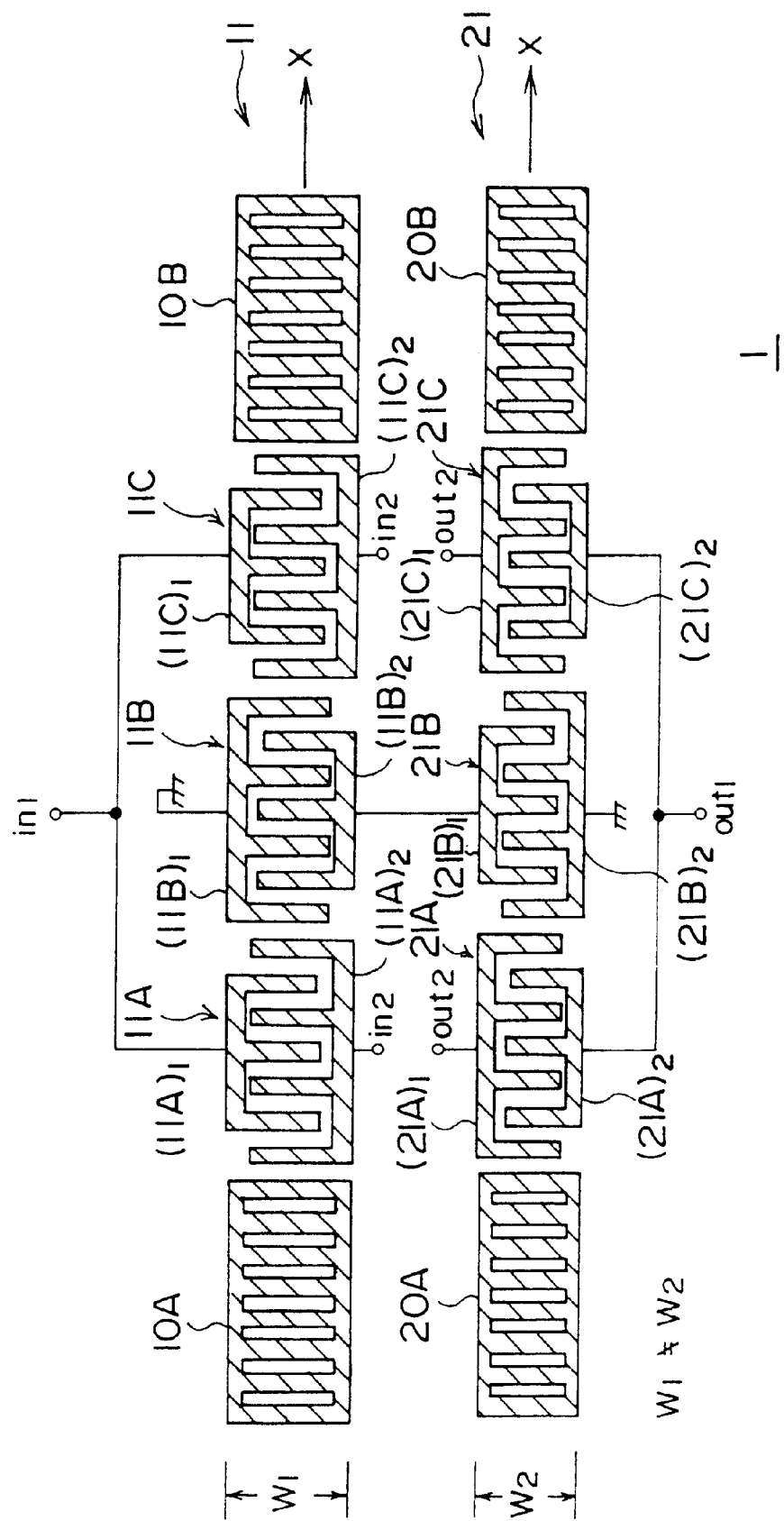
FIG. 18 is a diagram showing a modification of the SAW filter of FIG. 17.

FIG. 18 shows a modification of the embodiment of FIG. 17 in which the SAW filter is operated in a differential mode in FIG. 18, wherein those parts corresponding to the parts described previously are designated by the same reference numerals and the description thereof will be omitted.

Referring to FIG. 18, the secondary-side electrodes $(11A)_2$ and $(11C)_2$ of the interdigital electrodes 11A and 11C are supplied commonly with an input signal $IN_2$ different from an input signal $IN_1$ supplied to the primary-side electrodes $(11A)_1$ and $(11C)_1$. Further, an output signal $OUT_2$ different from an output signal $OUT_1$ obtained from the secondary-side electrodes $(21A)_2$ and $(21C)_2$ are obtained from the primary-side electrode $(21A)_1$ of the interdigital electrode 21A and the primary-side electrode $(21C)_1$. Similarly to the case of FIG. 7, it should be noted that the SAW filter of FIG. 18 has a construction in which the overlap width $W_1$ for the SAW filter 11 is different from the overlap width $W_2$ for the SAW filter 21.

Figure 19:
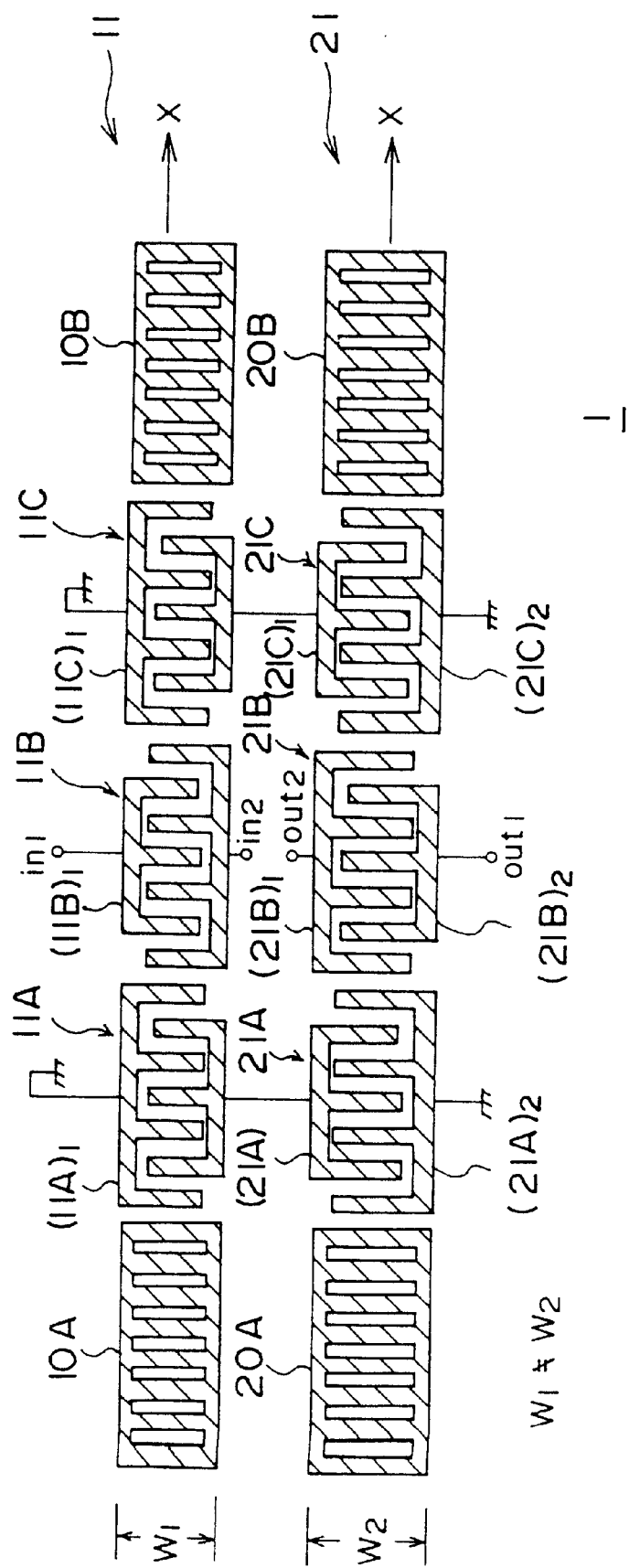
FIG. 19 is a diagram showing another modification of the SAW filter of FIG. 17.
Figure 20:
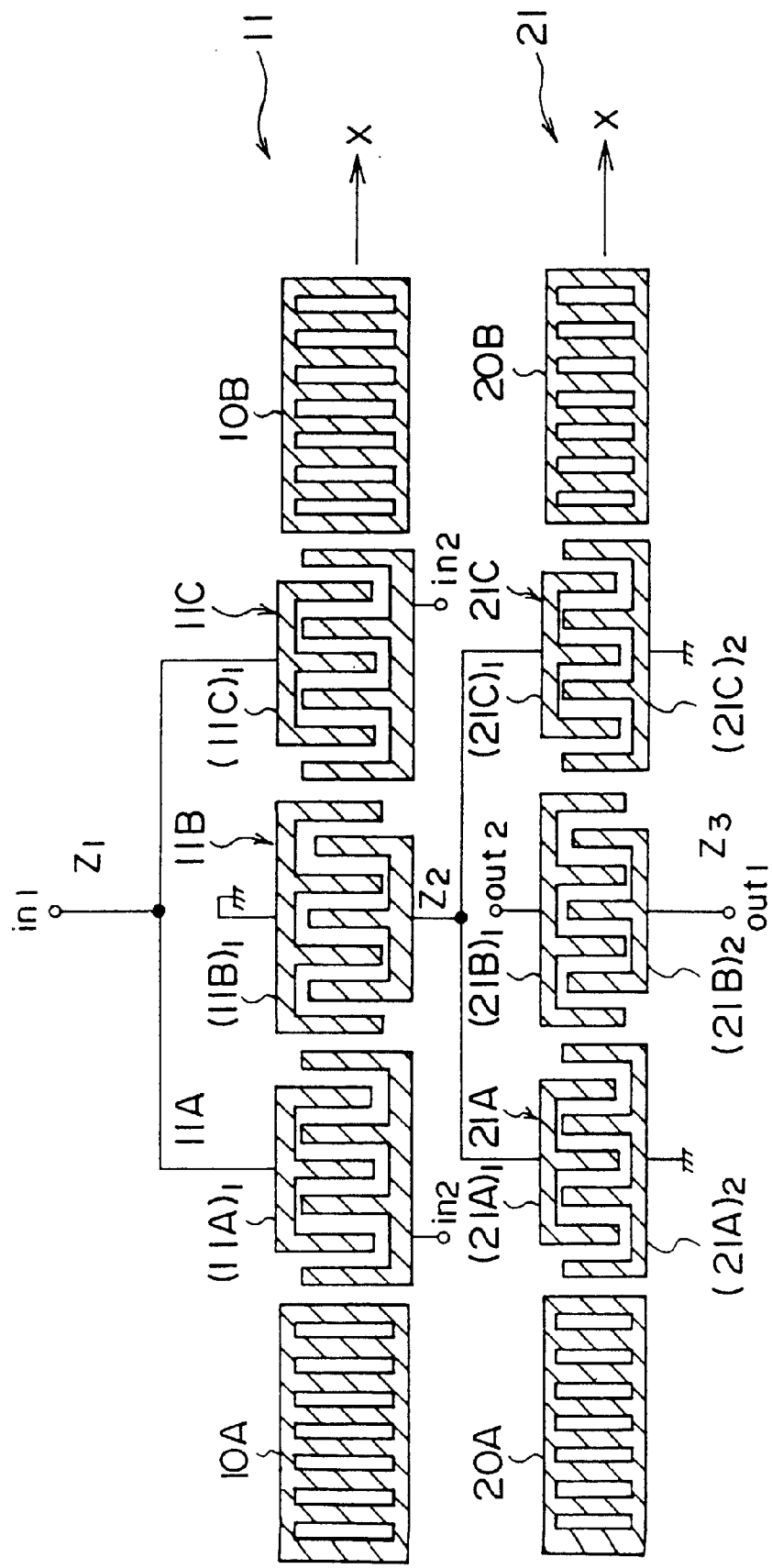
FIG. 20 is a diagram showing a further modification of the SAW filter of FIG. 17.

FIGS. 19 and 20 show respectively an example of modifying the SAW filters of FIGS. 8 and 9 to form differential mode SAW filters. In these examples, too, an input signal IN$_2$ different from the input signal IN$_1$ used in the example of FIG. 8 or FIG. 9 is supplied to the ground electrode, and an output signal OUT$_2$ different from the output signal OUT$_1$ is obtained at the ground electrode. As the construction of FIGS. 19 and 20 is obvious from the description heretofore, further description thereof will be omitted. In the construction of FIGS. 19 and 20, it should be noted that the differential construction may be provided only to one of the input-side and the output-side.

In each of the embodiments described heretofore, it is preferable to use a Y-cut single crystal plate of LiTaO$_3$ or LiNbO$_3$, with a cut angle of 40° Y–44° Y when LiTaO$_3$ is used or with a cut angle of 66° Y–74° Y when LiNbO$_3$ is used. When LiTaO$_3$ is used for the piezoelectric substrate 1, it is preferable to set the thickness of the interdigital electrodes on the substrate 1 to have a thickness of 5–10% the wavelength of the surface acoustic wave excited on the piezoelectric substrate 1, provided that the interdigital electrodes are formed of Al or an Al-alloy. When the piezoelectric substrate 1 is formed of LiNbO$_3$, on the other hand, it is preferable to form the interdigital electrodes with a thickness corresponding to 4–12% the wavelength of the surface acoustic wave excited on the piezoelectric substrate 1.

Further, the present invention is not limited to the embodiments described heretofore, but various variations and modifications may be made without departing from the scope of the invention.

What is claimed is:

1. A double-mode surface-acoustic-wave device comprising:

a piezoelectric substrate;

first and second reflectors provided on said piezoelectric substrate along a propagation path of a surface acoustic wave on said piezoelectric substrate;

first, second and third interdigital electrodes provided on said piezoelectric substrate consecutively between said first reflector and said second reflector wherein each of said first through third interdigital electrodes include first through third number of pairs of electrode fingers, respectively and the first number of pairs of electrode fingers for said first interdigital electrode is different from the third number of pairs of electrode fingers for said third interdigital electrode, wherein there holds a relationship X<Y<Z where X represents the first number of pairs of electrode fingers, Y represents the second number of pairs of electrode fingers, and Z represents the third number of pairs of electrode fingers.

\* \* \* \* \*